(12) United States Patent
Allen et al.

(10) Patent No.: US 11,440,311 B2
(45) Date of Patent: Sep. 13, 2022

(54) DIGITAL OFFSET LITHOGRAPHY INK COMPOSITION

(71) Applicant: Xerox Corporation, Norwalk, CT (US)

(72) Inventors: C. Geoffrey Allen, Waterdown (CA); Carolyn Moorlag, Mississauga (CA); Aurelian Valeriu Magdalinis, Newmarket (CA); Biby Esther Abraham, Mississauga (CA); Jonathan Siu-Chung Lee, Oakville (CA)

(73) Assignee: Xerox Corporation, Norwalk, CT (US)

( * ) Notice: Subject to any disclaimer, the term of this patent is extended or adjusted under 35 U.S.C. 154(b) by 457 days.

(21) Appl. No.: 15/920,652

(22) Filed: Mar. 14, 2018

(65) Prior Publication Data

US 2019/0283395 A1 Sep. 19, 2019

(51) Int. Cl.
*B41M 1/06* (2006.01)
*B41M 5/00* (2006.01)
(Continued)

(52) U.S. Cl.
CPC ............. *B41F 7/02* (2013.01); *B41F 7/16* (2013.01); *B41F 7/26* (2013.01); *B41F 23/00* (2013.01); *B41M 1/06* (2013.01); *B41M 5/0023* (2013.01); *B41N 3/06* (2013.01); *B41N 3/08* (2013.01); *C09D 11/023* (2013.01); *C09D 11/03* (2013.01); *C09D 11/06* (2013.01); *C09D 11/101* (2013.01); *C09D 11/102* (2013.01); *C09D 11/104* (2013.01); *C09D 11/106* (2013.01);
(Continued)

(58) Field of Classification Search
None
See application file for complete search history.

(56) References Cited

U.S. PATENT DOCUMENTS 5,036,128 A * 7/1991 Durand ............... C09D 11/101
428/323
6,787,583 B2 9/2004 Veya et al.
(Continued)

FOREIGN PATENT DOCUMENTS

EP 1 203 799 B1 5/2002
KR 100 852 648 8/2008
(Continued)

OTHER PUBLICATIONS

C. Geoffrey Allen, et al., U.S. Appl. No. 15/910,512, filed Mar. 2, 2018, "Digital Offset Lithography Ink Composition," not yet published, 47 pages, 2 drawing sheets.
(Continued)

*Primary Examiner* — Joshua D Zimmerman
(74) *Attorney, Agent, or Firm* — Marylou J. Lavoie, Esq. LLC

(57) ABSTRACT

An ink composition for use in digital offset printing including at least one component selected from the group consisting of a curable monomer and a curable oligomer; an optional dispersant; an optional photoinitiator; and at least one non-radiation curable additive, wherein the non-radiation curable additive is a detergent or an emulsifying agent, or wherein the non-radiation curable additive functions as a detergent or emulsifying agent when in the presence of a cleaning fluid, and wherein the non-radiation curable additive is a solid at a temperature of from about 20° C. to about 40° C.

21 Claims, 3 Drawing Sheets

(51) Int. Cl.
    *B41N 3/06*     (2006.01)
    *B41N 3/08*     (2006.01)
    *C09D 11/03*     (2014.01)
    *C09D 11/101*     (2014.01)
    *C09D 11/102*     (2014.01)
    *C09D 11/104*     (2014.01)
    *C09D 11/106*     (2014.01)
    *C09D 11/023*     (2014.01)
    *C09D 11/06*     (2006.01)
    *B41F 7/02*     (2006.01)
    *B41F 7/16*     (2006.01)
    *B41F 7/26*     (2006.01)
    *B41F 23/00*     (2006.01)
    *G03F 7/027*     (2006.01)

(52) U.S. Cl.
    CPC .......... *G03F 7/027* (2013.01); *B41P 2200/22* (2013.01); *B41P 2231/00* (2013.01); *B41P 2235/50* (2013.01)

(56) References Cited

U.S. PATENT DOCUMENTS

| | | |
|---|---|---|
| 8,636,307 B2 | 1/2014 | Magnn et al. |
| 8,835,530 B2 | 9/2014 | Schaefer et al. |
| 9,592,699 B2 | 3/2017 | Stowe et al. |
| 2003/0092820 A1 | 5/2003 | Schmidt et al. |
| 2007/0042142 A1 | 2/2007 | O'Brien et al. |
| 2011/0216122 A1* | 9/2011 | Maruyama ............... B41J 2/015 347/20 |
| 2012/0103212 A1 | 5/2012 | Stowe et al. |
| 2015/0119487 A1* | 4/2015 | Vanbesien ............ C09D 11/023 522/18 |
| 2015/0184004 A1 | 7/2015 | Jung et al. |
| 2016/0177113 A1* | 6/2016 | Allen ..................... C09D 11/12 101/450.1 |

FOREIGN PATENT DOCUMENTS

| | | |
|---|---|---|
| WO | WO 02/062894 A1 | 8/2002 |
| WO | WO 2013/188746 A2 | 12/2013 |
| WO | WO 2013/188746 A3 | 12/2013 |
| WO | WO-2017109785 A1 * | 6/2017 ........... C09D 11/107 |

OTHER PUBLICATIONS

Extended European Search Report issued in European Application No. 19162391.7-1022, dated May 27, 2019.

Canadian Office Action issued in Canadian Application No. 3,036,199, dated Apr. 28, 2020.

\* cited by examiner

DIGITAL OFFSET LITHOGRAPHY INK COMPOSITION

BACKGROUND

Disclosed herein are DALI (Digital Architecture for Lithographic Inks) ink compositions providing improved transferability and cleanability. More particularly disclosed is an ink composition for use in digital offset printing, comprising at least one component selected from the group consisting of a curable monomer and a curable oligomer; an optional dispersant; an optional photoinitiator; and at least one non-radiation curable additive, wherein the non-radiation curable additive is a detergent or an emulsifying agent, or wherein the non-radiation curable additive functions as a detergent or emulsifying agent when in the presence of a cleaning fluid, and wherein the non-radiation curable additive is a solid at a temperature of from about 20° C. to about 40° C.

Further disclosed is a process of digital offset printing with a digital offset printing device, the process comprising applying an ink composition onto a re-imageable imaging member surface at an ink take up temperature, the re-imageable imaging member having dampening fluid disposed thereon; forming an ink image; transferring the ink image from the re-imageable surface of the imaging member to a printable substrate at an ink transfer temperature; wherein the ink composition comprises at least one component selected from the group consisting of a curable monomer and a curable oligomer; an optional dispersant; an optional photoinitiator; and at least one non-radiation curable additive, wherein the non-radiation curable additive is a detergent or an emulsifying agent, or wherein the non-radiation curable additive functions as a detergent or emulsifying agent when in the presence of a cleaning fluid, and wherein the non-radiation curable additive is a solid at a temperature of from about 20° C. to about 40° C.

Further disclosed is a process comprising combining at least one component selected from the group consisting of a curable monomer and a curable oligomer; an optional dispersant; an optional photoinitiator; and at least one non-radiation curable additive wherein the non-radiation curable additive is a detergent or an emulsifying agent, or wherein the non-radiation curable additive functions as a detergent or emulsifying agent when in the presence of a cleaning fluid, and wherein the non-radiation curable additive is a solid at a temperature of from about 20° C. to about 40° C.; optionally, heating; and optionally, filtering; to provide an ink composition.

DALI (Digital Architecture for Lithographic Inks) inks are offset type inks that are specifically designed and optimized to be compatible with the different indirect printing subsystems, including ink delivery subsystem, imaging subsystem, and cleaning subsystem, that enable high quality printing at high speed. Beyond having reliable inks, it is desirable that the resultant radiation cured prints prepared with these inks have reliable robustness properties including good chemical resistance and adhesion to the substrate even when having been cured at speeds of 1 meter/second or greater.

An exemplary digital offset printing architecture is shown in FIG. 1. As seen in FIG. 1, an exemplary system 100 may include an imaging member 110. The imaging member 110 in the embodiment shown in FIG. 1 is a drum, but this exemplary depiction should not be interpreted so as to exclude embodiments wherein the imaging member 110 includes a plate or a belt, or another now known or later developed configuration. The re-imageable surface 110(a) may be formed of materials including, for example, a class of materials commonly referred to as silicones, including fluorosilicone, among others. The re-imageable surface may be formed of a relatively thin layer over a mounting layer, a thickness of the relatively thin layer being selected to balance printing or marking performance, durability and manufacturability.

U.S. patent application Ser. No. 13/095,714 ("714 Application"), entitled "Variable Data Lithography System," filed on Apr. 27, 2011, by Timothy Stowe et al., which is commonly assigned, and the disclosure of which is hereby incorporated by reference herein in its entirety, depicts details of the imaging member 110 including the imaging member 110 being comprised of a re-imageable surface layer 110(a) formed over a structural mounting layer that may be, for example, a cylindrical core, or one or more structural layers over a cylindrical core.

The imaging member 110 is used to apply an ink image to an image receiving media substrate 114 at a transfer nip 112. The transfer nip 112 is formed by an impression roller 118, as part of an image transfer mechanism 160, exerting pressure in the direction of the imaging member 110. Image receiving medium substrate 114 includes, but is not limited to, any particular composition or form such as, for example, paper, plastic, folded paperboard, Kraft paper, clear substrates, metallic substrates or labels. The exemplary system 100 may be used for producing images on a wide variety of image receiving media substrates. The 714 Application also explains the wide latitude of marking (printing) materials that may be used.

The exemplary system 100 includes a dampening fluid system 120 (FS Dampening System) generally comprising a series of rollers, which may be considered as dampening rollers or a dampening unit, for uniformly wetting the re-imageable surface of the imaging member 110 with dampening fluid. A purpose of the dampening fluid system 120 is to deliver a layer of dampening fluid, generally having a uniform and controlled thickness, to the re-imageable surface of the imaging member 110. It is known that a dampening fluid such as fountain solution may comprise mainly water optionally with small amounts of isopropyl alcohol or ethanol added to reduce surface tension as well as to lower evaporation energy necessary to support subsequent laser patterning, as will be described in greater detail below. Small amounts of certain surfactants may be added to the fountain solution as well. Alternatively, other suitable dampening fluids may be used to enhance the performance of ink based digital lithography systems. Exemplary dampening fluids include water, Novec™ 7600 (1,1,1,2,3,3-Hexafluoro-4-(1,1,2,3,3,3-hexafluoropropoxy)pentane.), and D4 (octamethylcyclotetrasiloxane). Other suitable dampening fluids are disclosed, by way of example, in co-pending U.S. Pat. No. 9,592,699, the disclosure of which is hereby incorporated herein by reference in its entirety.

Once the dampening fluid is metered onto the re-imageable surface of the imaging member 110, a thickness of the dampening fluid may be measured using a sensor (not shown) that may provide feedback to control the metering of the dampening fluid onto the re-imageable surface of the imaging member 110 by the dampening fluid system 120.

After a precise and uniform amount of dampening fluid is provided by the dampening fluid system 120 on the re-imageable surface of the imaging member 110, an optical patterning subsystem 130 may be used to selectively form a latent image in the uniform dampening fluid layer by image-wise patterning the dampening fluid layer using, for example, laser energy. Typically, the dampening fluid will not absorb the optical energy (IR or visible) efficiently. The re-imageable surface of the imaging member 110 should ideally absorb most of the laser energy (visible or invisible such as IR) emitted from the optical patterning subsystem 130 close to the surface to minimize energy wasted in heating the dampening fluid and to minimize lateral spreading of heat in order to maintain a high spatial resolution capability. Alternatively, an appropriate radiation sensitive component may be added to the dampening fluid to aid in the absorption of the incident radiant laser energy. While the optical patterning subsystem 130 is described above as being a laser emitter, it should be understood that a variety of different systems may be used to deliver the optical energy to pattern the dampening fluid.

The mechanics at work in the patterning process undertaken by the optical patterning subsystem 130 of the exemplary system 100 are described in detail with reference to FIG. 5 in the 714 Application. Briefly, the application of optical patterning energy from the optical patterning subsystem 130 results in selective removal of portions of the layer of dampening fluid.

Following patterning of the dampening fluid layer by the optical patterning subsystem 130, the patterned layer over the re-imageable surface of the imaging member 110 is presented to an inker subsystem 140. The inker subsystem 140 is used to apply a uniform layer of ink over the layer of dampening fluid and the re-imageable surface layer of the imaging member 110. The inker subsystem 140 may use an anilox roller to meter an offset lithographic ink, such as the ink compositions of the present disclosure, onto one or more ink forming rollers that are in contact with the re-imageable surface layer of the imaging member 110. Separately, the inker subsystem 140 may include other traditional elements such as a series of metering rollers to provide a precise feed rate of ink to the re-imageable surface. The inker subsystem 140 may deposit the ink to the pockets representing the imaged portions of the re-imageable surface, while ink on the unformatted portions of the dampening fluid will not adhere to those portions.

The cohesiveness and viscosity of the ink residing in the re-imageable layer of the imaging member 110 may be modified by a number of mechanisms. One such mechanism may involve the use of a rheology (complex viscoelastic modulus) control subsystem 150 (for example, a UV LED partial cure system). The rheology control system 150 may form a partial crosslinking layer of the ink on the re-imageable surface to, for example, increase ink cohesive strength relative to the re-imageable surface layer. Curing mechanisms may include optical or photo curing, heat curing, drying, or various forms of chemical curing. Cooling may be used to modify rheology as well via multiple physical cooling mechanisms, as well as via chemical cooling.

The ink is then transferred from the re-imageable surface of the imaging member 110 to a substrate of image receiving medium 114 using a transfer subsystem 160. The transfer occurs as the substrate 114 is passed through a nip 112 between the imaging member 110 and an impression roller 118 such that the ink within the voids of the re-imageable surface of the imaging member 110 is brought into physical contact with the substrate 114. With the adhesion of the ink, such as the ink of the present disclosure, having been modified by the rheology control system 150, modified adhesion of the ink causes the ink to adhere to the substrate 114 and to separate from the re-imageable surface of the imaging member 110. Careful control of the temperature and pressure conditions at the transfer nip 112 may allow transfer efficiencies for the ink, such as the ink of the present disclosure, from the re-imageable surface of the imaging member 110 to the substrate 114 to exceed 95%. While it is possible that some dampening fluid may also wet substrate 114, the volume of such a dampening fluid may be minimal, and may rapidly evaporate or be absorbed by the substrate 114.

In certain offset lithographic systems, it should be recognized that an offset roller, not shown in FIG. 1, may first receive the ink image pattern and then transfer the ink image pattern to a substrate according to a known indirect transfer method.

Following the transfer of the majority of the ink to the substrate 114, any residual ink and/or residual dampening fluid may be removed from the re-imageable surface of the imaging member 110, typically without scraping or wearing that surface. An air knife may be employed to remove residual dampening fluid. It is anticipated, however, that some amount of ink residue may remain. Removal of such remaining ink residue may be accomplished through use of some form of cleaning subsystem 170. The 714 Application describes details of such a cleaning subsystem 170 including at least a first cleaning member such as a sticky or tacky member in physical contact with the re-imageable surface of the imaging member 110, the sticky or tacky member removing residual ink and any remaining small amounts of surfactant compounds from the dampening fluid of the re-imageable surface of the imaging member 110. The sticky or tacky member may then be brought into contact with a smooth roller to which residual ink may be transferred from the sticky or tacky member, the ink being subsequently stripped from the smooth roller by, for example, a doctor blade.

The 714 Application details other mechanisms by which cleaning of the re-imageable surface of the imaging member 110 may be facilitated. Regardless of the cleaning mechanism, however, cleaning of the residual ink and dampening fluid from the re-imageable surface of the imaging member 110 may be used to prevent ghosting in the system. Once cleaned, the re-imageable surface of the imaging member 110 is again presented to the dampening fluid system 120 by which a fresh layer of dampening fluid is supplied to the re-imageable surface of the imaging member 110, and the process is repeated.

In embodiments, a digital offset printing process involves the transfer of a pigmented UV (ultra violet) curable ink onto a fluorosilicone printing plate which has been partially coated with a release agent or fountain solution, such as is commercially sold as D4. The ink is then optionally subjected to partial cure using UV light and transferred from the plate to the object, which can be made from paper, plastic or metal, being printed. The ink on the object is again exposed to UV light for final curing of the ink.

In order to meet digital offset printing requirements, the ink desirably possesses many physical and chemical properties. The ink is desirably compatible with materials it is in contact with, including printing plate, fountain solution, and other cured or non-cured inks. It also desirably meets functional requirements of the sub-systems, including wetting and transfer properties. Transfer of the imaged inks is challenging, as the ink desirably possesses the combination of wetting and transfer traits, that is, the ink desirably at once wets the blanket material homogeneously, and transfers from the blanket to the substrate. Transfer of the image layer is desirably efficient, desirably at least as high as 90%, as the cleaning sub-station can only eliminate small amounts of residual ink. Any ink remaining on the blanket after cleaning can result in an unacceptable ghost image appearing in subsequent prints. Not surprisingly, ink rheology can play a key role in the transfer characteristics of an ink.

The DALI ink further desirably meets functional requirements of the sub-systems including possessing desired wetting and transfer properties. Thus, DALI inks are different in many ways to other inks developed for other printing applications such as pigmented solid (or phase change) inks. Digital offset or DALI inks preferably contain much higher (in embodiments up to ten times higher) pigment loading and therefore have a higher viscosity at room temperature. High viscosity is desired for transfer, but must be low enough for anilox take-up and delivery to the fluorosilicone plate.

Thus, digital offset DALI architectures require offset type inks that are specifically designed and optimized to be compatible with the different subsystems, including ink delivery system, imaging system and cleaning subsystem, that enable high quality printing at high speed. Reliable high speed printing demands that the ink transfer efficiency be as high as possible from the imaged blanket to the receiving substrate otherwise image degradation and poor resolution would result. Also, due to the prospect that DALI printers would be able to digitally print any number of short, medium and long runs, it is desirable that any amount of ink not transferred from the blanket to the receiving substrate be completely or substantially completely removed before a subsequent image development cycle begins. This can be difficult owing to both the short transit time between image development and transfer cycles as well as the fact that DALI inks, owing to the nature of their design and function, are sticky and have relatively high viscosity at and near room temperature.

U.S. patent application Ser. No. 15/910,512, which is hereby incorporated by reference herein in its entirety, describes in the Abstract thereof an ink composition for use in digital offset printing including at least one component selected from the group consisting of a curable monomer and a curable oligomer; an optional colorant; an optional dispersant; an optional photoinitiator; and at least one non-radiation curable additive, wherein the non-radiation curable additive is a solid at a temperature of from about 20° C. to about 40° C. A process of digital offset printing including applying the ink composition onto a re-imageable imaging member surface at an ink take up temperature, the re-imageable imaging member having dampening fluid disposed thereon; forming an ink image; transferring the ink image from the re-imageable surface of the imaging member to a printable substrate at an ink transfer temperature.

While currently available inks may be suitable for their intended purposes, there remains a need for DALI inks that enable 1) high transfer efficiency from the blanket to the receiving substrate, and 2) their residuals on the blanket (after image transfer step) be more easily cleanable.

The appropriate components and process aspects of the each of the foregoing U. S. Patents and Patent Publications may be selected for the present disclosure in embodiments thereof. Further, throughout this application, various publications, patents, and published patent applications are referred to by an identifying citation. The disclosures of the publications, patents, and published patent applications referenced in this application are hereby incorporated by reference into the present disclosure to more fully describe the state of the art to which this invention pertains.

SUMMARY

Described is an ink composition for use in digital offset printing, comprising at least one component selected from the group consisting of a curable monomer and a curable oligomer; an optional dispersant; an optional photoinitiator; and at least one non-radiation curable additive, wherein the non-radiation curable additive is a detergent or an emulsifying agent, or wherein the non-radiation curable additive functions as a detergent or emulsifying agent when in the presence of a cleaning fluid, and wherein the non-radiation curable additive is a solid at a temperature of from about 20° C. to about 40° C.

Also described is a process of digital offset printing with a digital offset printing device, the process comprising applying an ink composition onto a re-imageable imaging member surface at an ink take up temperature, the re-imageable imaging member having dampening fluid disposed thereon; forming an ink image; transferring the ink image from the re-imageable surface of the imaging member to a printable substrate at an ink transfer temperature; wherein the ink composition comprises at least one component selected from the group consisting of a curable monomer and a curable oligomer; an optional dispersant; an optional photoinitiator; and at least one non-radiation curable additive, wherein the non-radiation curable additive is a detergent or an emulsifying agent, or wherein the non-radiation curable additive functions as a detergent or emulsifying agent when in the presence of a cleaning fluid, and wherein the non-radiation curable additive is a solid at a temperature of from about 20° C. to about 40° C.

Also described is a process comprising combining at least one component selected from the group consisting of a curable monomer and a curable oligomer; an optional dispersant; an optional photoinitiator; and at least one non-radiation curable additive wherein the non-radiation curable additive is a detergent or an emulsifying agent, or wherein the non-radiation curable additive functions as a detergent or emulsifying agent when in the presence of a cleaning fluid, and wherein the non-radiation curable additive is a solid at a temperature of from about 20° C. to about 40° C.; optionally, heating; and optionally, filtering; to provide an ink composition.

DETAILED DESCRIPTION

Figure 1:
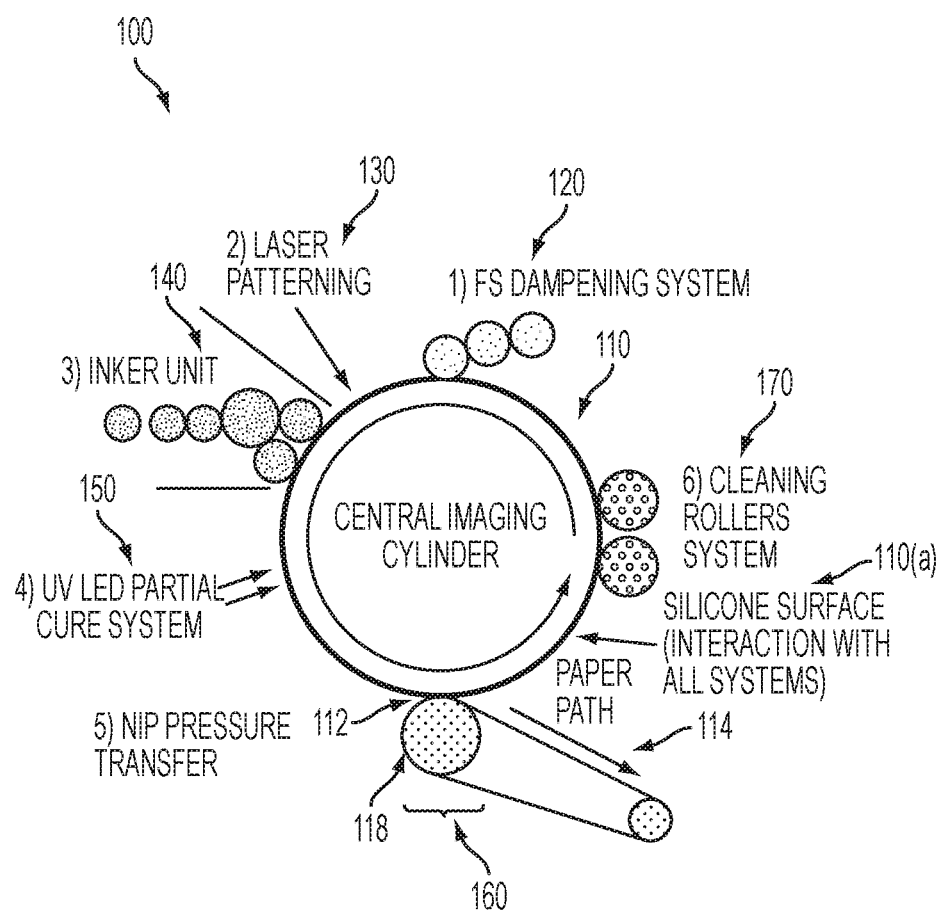
FIG. 1 illustrates a schematic representation of a related art ink-based variable image digital printing system with which the ink compositions according to this disclosure may be used.

In embodiments, an ink composition for use in digital offset printing is provided comprising at least one component selected from the group consisting of a curable monomer and a curable oligomer; an optional dispersant; an optional photoinitiator; and at least one non-radiation curable additive, wherein the non-radiation curable additive is a detergent or an emulsifying agent, or wherein the non-radiation curable additive functions as a detergent or emulsifying agent when in the presence of a cleaning fluid, and wherein the non-radiation curable additive is a solid at a temperature of from about 20° C. to about 40° C.

The non-radiation curable detergent or emulsifying agent additive is a miscible additive particularly suited for use in DALI ink compositions to improve the transferability of an imaged ink on a blanket to a receiving substrate. The additives herein by their nature are non-radiation curable but as components comprised in the DALI ink composition, they do not interfere with the level of cure and physical robustness of the resultant prints from these inks and in some cases enhance the robustness qualities of prints made from these inks. The use of these same miscible additives in DALI ink compositions also improves the cleaning efficacy of the compositions. With water or surfactant/water as the cleaning solvents, miscible additives present in the ink compositions can act as emulsifying agents and/or also have detergent-like qualities (when in the presence of the cleaning fluid) to reduce the viscosity and stickiness of the ink and allow it to be cleaned more easily.

Additive.

The non-radiation curable additive selected for embodiments herein can comprise any suitable or desired non-radiation curable additive provided that the additive is a detergent or an emulsifying agent, or a compound that functions as a detergent or emulsifying agent when in the presence of a cleaning fluid, in embodiments, when in the present of a cleaning fluid comprising a cleaning fluid of a cleaning offset printing device, in embodiments, a cleaning fluid comprising water or a combination of water and surfactant; and further provided that the non-curable additive is a solid at or near room temperature.

By non-radiation curable or non-curable it is meant that the additive in the ink is not cross-linkable by such means from exposure to, for example, heat, electromagnetic radiation, electron beam energies and the like.

In embodiments, the non-radiation curable additive is a solid at a temperature of from about 20° C. to about 40° C., or from about 20° C. to about 30° C., or from about 20° C. to about 25° C.

A key part of the design of DALI inks is to ensure functional anilox filling from ink loader, transfer to blanket, and ultimate high transfer of the ink image from the blanket to the receiving substrate. The present ink compositions including the ink additives described herein provided inks maintaining viscosity and tack properties within a specified range required to achieve key print functions. The ink compositions described including the additives selected herein improve the transfer of the ink from the imaging blanket to the receiving substrate and also aid in the cleanability of the residual ink from the blanket, while not impacting other key properties.

The additives selected for the present DALI ink enable the DALI ink to function normally with respect to ink delivery and anilox filling, transfer to blanket and subsequent transfer to receiving substrate but, upon reaching a cleaning substation of the DALI printing process, serve to break up the residual ink on the blanket when in the presence of the cleaning substation's solvents, namely water or surfactant/water, rendering the ink easier to remove while still in the uncured state.

The non-radiation curable detergent or emulsifying agent additives can be selected from various chemical classes or groupings and molecular weight ranges. Examples of suitable additives include those selected from polyether alcohol, diol, poly(oxyethylene) alkyl ether, polyol copolymer, emulsifying wax, polyester glycol, ester wax, sorbitan ester, ethoxylated sorbitan ester, and polyester chemical classes. Additive properties such as safety, melting point or congealing point or glass transition temperature as well as the cleaning/detergency properties of the additives are considered when selecting an additive for a DALI ink composition here. Most of the additives may be used in everyday household products including soaps, detergents, cosmetics, hair conditioners, creams, candles, etc. and regularly involve human contact and so are considered safe.

Some of the additives from the various chemical classes selected in embodiments herein are soluble or miscible in water while others are not. The water-insoluble additives can still act as releasing agents which most notably can improve transfer of an ink image from a fluorosilicone blanket to a receiving substrate such as coated paper. Additives that are water-insoluble can include poly(ε-caprolactone) of varying molecular weights that can add flexibility and toughness to the printed ink.

In embodiments, water-soluble polyether alcohol and diol additives are selected which can aid in the ink cleaning cycle of the DALI printing process via lubricating ability. Other additives can act as oil-in-water emulsifiers for hydrophobic DALI inks, such as various poly(oxyethylene) alkyl ethers including fatty alcohol ethoxylates and emulsifying waxes such as alkenyl alkenates, fatty alcohols and mixtures of these compounds. Still other materials can be used to aid in the ink cleaning cycle, such as polyol copolymers, or specifically ethoxylate-propoxylate block co-polymers, which increase the solubility/miscibility of oil-phase materials with water.

Within the chemical classes of non-radiation curable miscible additives included in DALI inks of the present embodiments, it has been observed, that the additives herein do not adversely affect the pigment and clay dispersion quality or adversely affect other key ink properties such as the rheology of certain DALI ink compositions at certain temperatures, such as at 25° C., at 45° C., etc., or the tack (internal cohesion) of the ink, and the additives herein further impart an emulsifying, detergency or lubricating quality to the DALI inks suitable to be cleaned by water-borne media.

Various additives having different chemical structures and molecular weights suitable as additives in the present embodiments are summarized in Table 1. Where possible, the molecular weights of the components were included. The size range of additives suitable for the present embodiments include small molecules, oligomers and polymers. The additives can be linear or branched. In embodiments, the additives are single-component-based while others are multi-component-based.

In embodiments, the non-radiation curable additive is selected from the group consisting of polyether alcohol, diol, poly(oxyethylene) alkyl ether, polyol copolymer, emulsifying wax, polyester glycol, ester wax, sorbitan ester, ethoxylated sorbitan ester, polyester, and combinations thereof.

In other embodiments, the non-radiation curable additive is selected from the group consisting of polyethylene glycol, poly(ethylene-co-vinyl acetate), poly(vinyl alcohol), polyvinylpyrrolidone, behenyl acrylate, poly(ethylene terephthalate), poly(vinyl acetate), 1,6-hexanediol, an emulsifying wax comprising cetearyl alcohol and polysorbate 60, stearyl stearate, 1,8-octanediol, 1,2-tetradecanediol, 1,10-decanediol, polyoxyethylene (23) lauryl ether), polyoxyethylene (100) stearyl ether), polycaprolactone diol, polycaprolactone, poloxamer 188, behenyl behenate, stearyl behenate, cetyl stearate, stearyl stearate, polycaprolactone-block-polytetrahydrofuran-block-polycaprolactone, castor wax, sorbitan monostearate, sorbitan monopalmitate, cetyl alcohol, stearyl alcohol, cetostearyl alcohol, and combinations thereof.

In still other embodiments, the non-radiation curable additive is selected from the group consisting of polyethylene glycol, diol, emulsifying wax, alkyl alkenate, polyoxyethylene alkyl ether, polyol, polycaprolactone, polycaprolactone-block-polytetrahydrofuran-block-polycaprolactone, castor wax, and combinations thereof. In embodiments, the non-radiation curable additive is polyoxyethylene lauryl ether, polyoxyethylene stearyl ether, or a combination thereof.

The non-radiation curable additive can be present in the ink composition in any suitable or desired amount. In embodiments, the non-radiation curable additive is present in the ink composition in an amount of from about 1 to about 6 percent by weight based upon the total weight of the ink composition. In embodiments, the non-radiation curable additive is present in the ink composition in an amount of from about 1 to less than about 5 percent by weight based upon the total weight of the ink composition.

Monomers, Oligomers.

In embodiments, the ink composition of the present disclosure includes further components such as a suitable curable monomer. Examples of suitable materials include radically curable monomer compounds, such as acrylate and methacrylate monomer compounds. Specific examples of acrylate and methacrylate monomers include (but are not limited to) isobornyl acrylate, isobornyl methacrylate, lauryl acrylate, lauryl methacrylate, isodecylacrylate, isodecylmethacrylate, caprolactone acrylate, 2-phenoxyethyl acrylate, isooctylacrylate, isooctylmethacrylate, butyl acrylate, alkoxylated lauryl acrylate, ethoxylated nonyl phenol acrylate, ethoxylated nonyl phenol methacrylate, ethoxylated hydroxyethyl methacrylate, methoxy polyethylene glycol monoacrylate, methoxy polyethylene glycol monomethacrylate, tetrahydrofurfuryl methacrylate, tetrahydrofurfuryl methacrylate and the like, as well as mixtures or combinations thereof.

In embodiments, the at least one component selected from the group consisting of a curable monomer and a curable oligomer in the ink composition herein is a component selected from the group consisting of acrylated polyesters, acrylated polyethers, acrylated epoxies, urethane acrylates, and pentaerythritol tetraacrylate, and combinations thereof.

In specific embodiments, propoxylated trimethylolpropane triacrylate such as SR501 from Sartomer Co. is used. The monomers may be present in the ink composition of the present disclosure in any suitable or desired amount, in embodiments in an amount of from about 0% to about 50% by weight, such as about 1% to about 30% by weight, such as about 5% to about 30% by weight, such as about 5% to about 10% by weight, based upon the total weight of the ink composition.

In some embodiments, the ink composition of the present disclosure includes a curable oligomer. Suitable curable oligomers include, but are not limited to acrylated polyesters, acrylated polyethers, acrylated epoxies, urethane acrylates, and pentaerythritol tetraacrylate. Specific examples of suitable acrylated oligomers include, but are not limited to, acrylated polyester oligomers, such as CN2255®, CN2256®, CN294E®, CN2282® (Sartomer Co.), and the like, acrylated urethane oligomers, acrylated epoxy oligomers, such as CN2204®, CN110® (Sartomer Co.) and the like; and mixtures and combinations thereof. In embodiments, the at least one component selected from the group consisting of a curable monomer and a curable oligomer in the ink composition herein is a component selected from the group consisting of a tetrafunctional polyester acrylate oligomer, a propoxylated trimethylolpropane triacrylate monomer, and combinations thereof. The oligomers may be present in the ink composition in any suitable or desired amount, in embodiments in an amount of about 0% to about 50% by weight, such as about 1% to about 30% by weight, such as about 5% to about 30% by weight, based upon the total weight of the ink composition.

In certain embodiments, the inks described herein may include the following components: (a) radiation-curable water-dilutable monomer compounds, including mono-, di-, and tri-functional water-dilutable acrylate monomers, oligomers; (b) dispersants; (c) colorant; (d) clays or other additives; (e) initiators; (f) additional curable compounds including monomers, oligomers, including oligomers from Sartomer USA, LLC or Cytec Industries, Inc., prepolymers, polymers; (g) at least one non-radiation curable additive as described herein; (h) secondary additives including surfactants, free-radical scavengers, and the like; and (i) thermal stabilizers.

In embodiments, the water-diluted curable components may include any water-dilutable acrylate or methacrylate monomer compound(s) suitable for use as a vehicle that may be water dilutable, with an addition of water being available to adjust and/or enhance background performance for use in the variable digital data lithographic printing architecture. In embodiments, the water-diluted curable component is a water-dilutable functional acrylate monomer, a methacrylate monomer, a multifunctional acrylate monomer, a multifunctional methacrylate monomer, or a mixture or combination thereof. Exemplary acrylates may include acrylate monomers or polymers such as polyester acrylates Sartomer CN294E, Sartomer CD-501, Sartomer CN9014, Sartomer CN2282 and Sartomer CN2256. In embodiments, a mixture of the components is water-dilutable.

In embodiments, further examples of curable monomers and diluting acrylates which can be used in the ink compositions as vehicles may include trimethylolpropane triacrylate; SR-492, SR-501, SR-444, SR-454, SR-499, SR-502, SR-9035 and SR-415 from Sartomer; EBECRYL® 853 and EBECRYL® 5500 from Allnex. Trimethylolpropane triacrylate has a refractive index of 1.474, a specific gravity of 1.06 g/cm$^3$, an APHA Color of less than 300 and a viscosity range of 80 to 120 cps at 25° C. Sartomer SR-492 is a three mole propoxylated trimethylolpropane triacrylate and has a refractive index of 1.459, a specific gravity of 1.05 g/cm$^3$, a Tg of −15° C., an APHA Color of 30 and a viscosity of 90 cps at 25° C. Sartomer SR-501 is a six mole propoxylated trimethylolpropane triacrylate and has a refractive index of 1.4567, a specific gravity of 1.048 g/cm$^3$, a Tg of −2° C., an APHA Color of 90 and a viscosity of 125 cps at 25° C. Sartomer SR-444 is a pentaerythritol triacrylate and has a refractive index of 1.4801, a specific gravity of 1.162 g/cm$^3$, a Tg of 103° C., an APHA Color of 50 and a viscosity of 520 cps at 25° C. Sartomer SR-454 is a three mole ethoxylated trimethylolpropane triacrylate and has a refractive index of 1.4689, a specific gravity of 1.103 g/cm$^3$, a Tg of 120° C., an APHA Color of 55 and a viscosity of 60 cps at 25° C. Sartomer SR-499 is a six mole ethoxylated trimethylolpropane triacrylate and has a refractive index of 1.4691, a specific gravity of 1.106 g/cm$^3$, a Tg of −8° C., an APHA Color of 50 and a viscosity of 85 cps at 25° C. Sartomer SR-502 is a nine mole ethoxylated trimethylolpropane triacrylate and has a refractive index of 1.4691, a specific gravity of 1.11 g/cm$^3$, a Tg of −19° C., an APHA Color of 140 and a viscosity of 130 cps at 25° C. Sartomer SR-9035 is a fifteen mole ethoxylated trimethylolpropane triacrylate and has a refractive index of 1.4695, a specific gravity of 1.113 g/cm3, a Tg of −32° C., an APHA Color of 60 and a viscosity of 168 cps at 25° C. Sartomer SR-415 is a twenty mole ethoxylated trimethylolpropane triacrylate and has a refractive index of 1.4699, a specific gravity of 1.115 g/cm3, a Tg of −40° C., an APHA Color of 55 and a viscosity of 225 cps at 25° C. EBECRYL 853 is a low viscosity polyester triacrylate and has a specific gravity of 1.10 g/cm3, an APHA Color of 200 and a viscosity of 80 cps at 25° C. EBECRYL 5500 is a low viscosity glycerol derivative triacrylate and has a specific gravity of 1.07 g/cm$^3$, an APHA Color of 62 and a viscosity of 130 cps at 25° C. Other triacrylate, monoacrylate, diacrylate, tetraacrylate and higher functional acrylate monomers, diluting acrylates, and various combinations thereof, can also be used in the ink compositions as vehicles.

In embodiments, one or more components in a mixture may be non-water dilutable, if the ink is water dilutable, and the reactive component are themselves miscible. In the same way that water may be added, in some embodiments, co-reactive monomers may be added to control polarity of the ink. Specific examples of water-dilutable curable components include, but are not limited to, the functional water soluble aromatic urethane acrylate compound (available from CYTEC as EBECRYL® 2003), the di-functional compound polyethylene glycol diacrylate (available from CYTEC as EBECRYL® 11), and the tri-functional compound polyether triacrylate (available from CYTEC as EBECRYL® 12). The monomer or oligomer can be present in any suitable amount. In embodiments, the monomer or oligomer, or combination thereof is added in an amount of from about 10 to about 85%, or from about 30 to about 80%, or from about 50 to about 70%, by weight based on the total weight of the curable ink composition. Curable oligomers which can be used in the ink compositions as vehicles may include Sartomer CN294E; CN2256; CN2282; CN9014 and CN309. Sartomer CN294E is a tetrafunctional acrylated polyester oligomer. CN294E is a clear liquid having a specific gravity of 0.93 and a viscosity of 4,000 cps at 60° C. Sartomer CN2256 is a difunctional polyester acrylate oligomer and has a refractive index of 1.5062, a Tg of −22° C., a tensile strength of 675 psi, and a viscosity of 11,000 cps at 60° C.

Sartomer CN2282 is tetrafunctional acrylated polyester and is a clear liquid having a specific gravity of 1.15 and a viscosity of 2,500 cps at 60° C. Sartomer CN9014 is a difunctional acrylated urethane and is a non-clear liquid having a specific gravity of 0.93 and a viscosity of 19,000 cps at 60° C. Sartomer CN309 is an oligomer containing an acrylate ester that derives from an aliphatic hydrophobic backbone, or in other words is an aliphatic acrylate ester. CN309 is a clear liquid having a specific gravity of 0.92, a density of 7.68 pounds/gallon, a surface tension of 26.3 dynes/cm, a viscosity of 150 cps at 25° C., and a viscosity of 40 cps at 60° C.

Examples of curable oligomers which can be used in the ink compositions as vehicles may include CN294E, CN2256, CN2282, CN9014 and CN309 from Sartomer; EBECRYL® 8405, EBECRYL® 8411, EBECRYL® 8413, EBECRYL® 8465, EBECRYL® 8701, EBECRYL® 9260, EBECRYL® 546, EBECRYL® 657, EBECRYL® 809, and the like from Allnex. EBECRYL® 8405 is a tetrafunctional urethane acrylate diluted as 80 wt % by weight in 1,6-Hexanediol diacrylate (HDDA). EBECRYL® 8405 is a clear liquid having a Gardner Color of 2 and a viscosity of 4,000 cps at 60° C. EBECRYL® 8411 is a difunctional urethane acrylate diluted as 80 wt % by weight in isobornylacrylate (IBOA). EBECRYL® 8411 is a clear liquid having a viscosity range of 3,400 to 9,500 cps at 65° C. EBECRYL® 8413 is a difunctional urethane acrylate diluted as 67 wt % by weight in IBOA. EBECRYL® 8413 is a clear liquid having a viscosity of 35,000 cps at 60° C. EBECRYL® 8465 is a trifunctional urethane acrylate. EBECRYL® 8465 is a clear liquid having a Gardner Color of 2 and a viscosity of 21,000 cps at 60° C. EBECRYL® 8701 is a trifunctional urethane acrylate. EBECRYL® 8701 is a clear liquid having a Gardner Color of 2 and a viscosity of 4,500 cps at 60° C. EBECRYL® 9260 is a trifunctional urethane acrylate. EBECRYL® 9260 is a clear liquid having a Gardner Color of 2 and a viscosity of 4,000 cps at 60° C. EBECRYL® 546 is a trifunctional polyester acrylate. EBECRYL® 546 is a clear liquid having a Gardner Color of 1.5 and a viscosity of 350,000 cps at 25° C. EBECRYL® 657 is a tetrafunctional polyester acrylate. EBECRYL® 657 is a clear liquid having a Gardner Color of 4 and a viscosity of 125,000 cps at 25° C. EBECRYL® 809 is a trifunctional polyester acrylate. EBECRYL® 809 is a clear liquid having a Gardner Color of 3 and a viscosity of 1,300 cps at 60° C.

Photoinitiator.

In some embodiments, the ink composition includes a photoinitiator, such as a α-hydroxyketone photo-initiator (including α-hydroxyketone photoinitators sold under the trade name IRGACURE® 184, IRGACURE® 500, DAROCUR® 1173, and IRGACURE® 2959, which are manufactured by BASF), α-aminoketone photo-initiators (including α-aminoketone photo-initiators IRGACURE® 369, IRGACURE® 379, IRGACURE® 907, and IRGACURE® 1300, which are manufactured by BASF) and bisacyl phosphine photo-initiators (including bisacyl phospine photo-initiators sold under the trade name IRGACURE® 819, IRGACURE® 819DW, and IRGACURE® 2022, which are manufactured by BASF). Other suitable photo-initiators include monoacylphosphine oxide and bisacylphosphine oxide, such as 2,4,6-trimethylbenzoybiphenylphosphine oxide (manufactured by BASF under the trade name LUCIRIN® TPO); ethyl-2,4,6-trimethylbenzoylphenyl phosphinate (manufactured by BASF under the trade name LUCIRIN® TPO-L); mono- and bis-acylphosphine photoinitiators (such IRGACURE® 1700, IRGACURE® 1800, IRGACURE® 1850, and DAROCUR® 4265, manufactured by BASF), benzyldimethyl-ketal photo-initiators (such as IRGACURE® 651, manufactured by BASF) and oligo [2-hydroxy-2-methyl-1-[4-(1-methylvinyl)phenyl]propanone] (available as Esacure® KIP 150 from Lamberti); and the like, as well as mixtures thereof.

The photoinitiator or mixture of photoinitiators may be present in the ink composition of the instant disclosure in any suitable or desired amount, in embodiments, in an amount of about 0% to about 12% by weight, such as about 1% to about 10%, by weight such as about 2% to about 8% by weight, based upon the total weight of the ink composition.

In some embodiments, the ink composition of the present disclosure comprises a free radical scavenger, such as IRGASTAB® UV10, IRGASTAB® UV22 available from BASF or CN3216 available from Sartomer Co. The free radical scavenger may be present in the ink composition in any suitable or desired amount, in embodiments in an amount of about 0% to about 5% by weight, such as from about 0.5% to about 4% by weight, such as about 2% to about 3% by weight, based upon the total weight of the ink composition.

Filler.

In some embodiments, the ink composition of the present disclosure includes a filler or fillers. Suitable fillers may include, but are not limited to, amorphous, diatomaceous, fumed quartz and crystalline silica, clays, aluminum silicates, magnesium aluminum silicates, talc, mica, delaminated clays, calcium carbonates and silicates, gypsum, barium sulfate, zinc, calcium zinc molybdates, zinc oxide, phosphosilicates and borosilicates of calcium, barium and strontium, barium metaborate monohydrate, and the like. In specific embodiments, the filler may be clays from Southern Clay Products CLAYTONE® HA and CLAYTONE® HY. In some embodiments, filler may be present in the ink composition of the present disclosure in an amount from about 0% to about 50% by weight, such as about 1% to about 20% by weight, such as from about 2% to about 10% by weight, based upon the total weight of the ink composition.

Colorant.

The ink composition herein may also contain a colorant. Any suitable or desired colorant can be used in embodiments herein, including pigments, dyes, dye dispersions, pigments dispersions, and mixtures and combinations thereof.

The colorant may include any suitable or desired color including cyan, magenta, yellow, black, and combinations thereof. The robustness properties of the ink compositions herein are achieved with the additives described for any color or combination selected, including cyan, magenta, yellow, black, and combinations thereof. In embodiments, the colorant comprises a pigment. In further embodiments, the colorant is provided in the form of a pigment dispersion.

The colorant may be provided in the form of a colorant dispersion. In embodiments, the colorant dispersion has an average particle size of from about 20 to about 500 nanometers (nm), or from about 20 to about 400 nm, or from about 30 to about 300 nm. In embodiments, the colorant is selected from the group consisting of dyes, pigments, and combinations thereof, and optionally, the colorant is a dispersion comprising a colorant, an optional surfactant, and an optional dispersant.

As noted, any suitable or desired colorant can be selected in embodiments herein. The colorant can be a dye, a pigment, or a mixture thereof. Examples of suitable dyes include anionic dyes, cationic dyes, nonionic dyes, zwitterionic dyes, and the like. Specific examples of suitable dyes include Food dyes such as Food Black No. 1, Food Black No. 2, Food Red No. 40, Food Blue No. 1, Food Yellow No. 7, and the like, FD & C dyes, Acid Black dyes (No. 1, 7, 9, 24, 26, 48, 52, 58, 60, 61, 63, 92, 107, 109, 118, 119, 131, 140, 155, 156, 172, 194, and the like), Acid Red dyes (No. 1, 8, 32, 35, 37, 52, 57, 92, 115, 119, 154, 249, 254, 256, and the like), Acid Blue dyes (No. 1, 7, 9, 25, 40, 45, 62, 78, 80, 92, 102, 104, 113, 117, 127, 158, 175, 183, 193, 209, and the like), Acid Yellow dyes (No. 3, 7, 17, 19, 23, 25, 29, 38, 42, 49, 59, 61, 72, 73, 114, 128, 151, and the like), Direct Black dyes (No. 4, 14, 17, 22, 27, 38, 51, 112, 117, 154, 168, and the like), Direct Blue dyes (No. 1, 6, 8, 14, 15, 25, 71, 76, 78, 80, 86, 90, 106, 108, 123, 163, 165, 199, 226, and the like), Direct Red dyes (No. 1, 2, 16, 23, 24, 28, 39, 62, 72, 236, and the like), Direct Yellow dyes (No. 4, 11, 12, 27, 28, 33, 34, 39, 50, 58, 86, 100, 106, 107, 118, 127, 132, 142, 157, and the like), Reactive Dyes, such as Reactive Red Dyes (No. 4, 31, 56, 180, and the like), Reactive Black dyes (No. 31 and the like), Reactive Yellow dyes (No. 37 and the like); anthraquinone dyes, monoazo dyes, disazo dyes, phthalocyanine derivatives, including various phthalocyanine sulfonate salts, aza(18)annulenes, formazan copper complexes, triphenodioxazines, and the like; as well as mixtures thereof.

Examples of suitable pigments include black pigments, white pigments, cyan pigments, magenta pigments, yellow pigments, and the like. Further, pigments can be organic or inorganic particles. Suitable inorganic pigments include carbon black. However, other inorganic pigments may be suitable such as titanium oxide, cobalt blue ($CoO$—$Al_2O_3$), chrome yellow ($PbCrO_4$), and iron oxide. Suitable organic pigments include, for example, azo pigments including diazo pigments and monoazo pigments, polycyclic pigments (e.g., phthalocyanine pigments such as phthalocyanine blues and phthalocyanine greens), perylene pigments, perinone pigments, anthraquinone pigments, quinacridone pigments, dioxazine pigments, thioindigo pigments, isoindolinone pigments, pyranthrone pigments, and quinophthalone pigments), insoluble dye chelates (e.g., basic dye type chelates and acidic dye type chelate), nitro pigments, nitroso pigments, anthanthrone pigments such as PR168, and the like. Representative examples of phthalocyanine blues and greens include copper phthalocyanine blue, copper phthalocyanine green, and derivatives thereof (Pigment Blue 15, Pigment Green 7, and Pigment Green 36). Representative examples of quinacridones include Pigment Orange 48, Pigment Orange 49, Pigment Red 122, Pigment Red 192, Pigment Red 202, Pigment Red 206, Pigment Red 207, Pigment Red 209, Pigment Violet 19, and Pigment Violet 42. Representative examples of anthraquinones include Pigment Red 43, Pigment Red 194, Pigment Red 177, Pigment Red 216 and Pigment Red 226. Representative examples of perylenes include Pigment Red 123, Pigment Red 149, Pigment Red 179, Pigment Red 190, Pigment Red 189 and Pigment Red 224. Representative examples of thioindigoids include Pigment Red 86, Pigment Red 87, Pigment Red 88, Pigment Red 181, Pigment Red 198, Pigment Violet 36, and Pigment Violet 38. Representative examples of heterocyclic yellows include Pigment Yellow 1, Pigment Yellow 3, Pigment Yellow 12, Pigment Yellow 13, Pigment Yellow 14, Pigment Yellow 17, Pigment Yellow 65, Pigment Yellow 73, Pigment Yellow 74, Pigment Yellow 90, Pigment Yellow 110, Pigment Yellow 117, Pigment Yellow 120, Pigment Yellow 128, Pigment Yellow 138, Pigment Yellow 150, Pigment Yellow 151, Pigment Yellow 155, and Pigment Yellow 213. Such pigments are commercially available in either powder or press cake form from a number of sources including, BASF Corporation, Engelhard Corporation, and Sun Chemical Corporation. Examples of black pigments that may be used include carbon pigments. The carbon pigment can be almost any commercially available carbon pigment that provides acceptable optical density and print characteristics. Carbon pigments suitable for use in the present system and method include, without limitation, carbon black, graphite, vitreous carbon, charcoal, and combinations thereof. Such carbon pigments can be manufactured by a variety of known methods, such as a channel method, a contact method, a furnace method, an acetylene method, or a thermal method, and are commercially available from such vendors as Cabot Corporation, Columbian Chemicals Company, Evonik, and E.I. DuPont de Nemours and Company. Suitable carbon black pigments include, without limitation, Cabot pigments such as MONARCH®® 1400, MONARCH® 1300, MONARCH® 1100, MONARCH® 1000, MONARCH® 900, MONARCH® 880, MONARCH® 800, MONARCH® 700, CAB-O-JET® 200, CAB-O-JET 300, REGAL, BLACK PEARLS®, ELFTEX®, MOGUL®, and VULCAN® pigments; Columbian pigments such as RAVEN® 5000, and RAVEN® 3500; Evonik pigments such as Color Black FW 200, FW 2, FW 2V, FW 1, FW18, FW 5160, FW 5170, Special Black 6, Special Black 5, Special Black 4A, Special Black 4, PRINTEX® U, PRINTEX® 140U, PRINTEX® V, and PRINTEX® 140V. The above list of pigments includes unmodified pigment particulates, small molecule attached pigment particulates, and polymer-dispersed pigment particulates. Other pigments can also be selected, as well as mixtures thereof. The pigment particle size is desired to be as small as possible to enable a stable colloidal suspension of the particles in the liquid vehicle and to prevent clogging of the ink channels when the ink is used in a thermal ink jet printer or a piezoelectric ink jet printer. In embodiments, the colorant is a magenta colorant. In embodiments, the colorant is a magenta pigment.

The colorant can be present in the ink composition in any desired or effective amount, in embodiments, the colorant can be present in an amount of from about 0.05 to about 15 percent, or from about 0.1 to about 10 percent, or from about 1 to about 5 percent by weight, based on the total weight of the ink composition.

In embodiments, the ink composition herein further enables use of a high colorant concentration, in embodiments a colorant or pigment concentration of greater than 50 percent, in embodiments, greater than 60 percent, by weight based on the total weight of the ink composition, while maintaining desired characteristics of desired viscosity at room temperature and desired viscosity at heated temperature for ink transfer.

Dispersant.

In some embodiments, the colorant is dispersed in a suitable dispersant. In embodiments, suitable dispersants include copolymers and block copolymers containing pigment affinic groups, such as amines, esters, alcohols and carboxylic acids and salts thereof. Illustrative examples of suitable dispersants include dispersants selected from Efka® 4008, Efka® 4009, Efka® 4047, Efka® 4520, Efka® 4010, Efka® 4015, Efka® 4020, Efka® 4050, Efka® 4055, Efka® 4080, Efka® 4300, Efka® 4330, Efka® 4400, Efka® 4401, Efka® 4403, Efka® 4406, Efka® 4800, all available from BASF, Charlotte, N.C., Disperbyk® 101, Disperbyk® 102, Disperbyk® 107, Disperbyk® 108, Disperbyk® 109, Disperbyk® 110, Disperbyk® 111, Disperbyk® 112, Disperbyk® 115, Disperbyk® 162, Disperbyk® 163, Disperbyk® 164, Disperbyk® 2001, all available from BYK Additives & Instruments, Wesel Germany, Solsperse® 24000 SC/GR, Solsperse® 26000, Solsperse® 32000, Solsperse® 36000, Solsperse® 39000, Solsperse® 41000, Solsperse® 71000 all available from Lubrizol Advanced Materials, Inc. Cleveland, Ohio or mixtures or combinations thereof.

In specific embodiments, the dispersant includes K-Sperse® XDA-504 from King Industries, Norfolk, Conn. The dispersant may be present in the ink composition of the instant disclosure in an amount of about 0% to about 30% by weight, or from about 0% to about 20% by weight, or from about 1% to about 10% by weight, or from about 6% to about 10% by weight, based upon the total weight of the white ink composition.

In certain embodiments, the colorant and the dispersant together are present in the ink composition in an amount of from about 50 percent to about 85 percent by weight based on the total weight of the ink composition.

The ink compositions can be prepared by any suitable process, such as by simple mixing of the ingredients. One process entails mixing all of the ink ingredients together and filtering the mixture to obtain an ink. Inks can be prepared by mixing the ingredients, heating if desired, and filtering, followed by adding any desired additional additives to the mixture and mixing at room temperature with moderate shaking until a homogeneous mixture is obtained, in embodiments from about 5 to about 10 minutes. Alternatively, the optional ink additives can be mixed with the other ink ingredients during the ink preparation process, which takes place according to any desired procedure, such as by mixing all the ingredients, heating if desired, and filtering.

In embodiments, a process herein comprises combining at least one component selected from the group consisting of a curable monomer and a curable oligomer; an optional dispersant; an optional photoinitiator; and at least one non-radiation curable additive, wherein the non-radiation curable additive is a detergent or an emulsifying agent, or wherein the non-radiation curable additive functions as a detergent or emulsifying agent when in the presence of a cleaning fluid, and wherein the non-radiation curable additive is a solid at a temperature of from about 20° C. to about 40° C.; optionally, heating; and optionally, filtering; to provide an ink composition.

The present disclosure further provides a method of digital offset printing, which includes applying the white ink composition of the present disclosure onto a re-imageable imaging member surface, the re-imageable imaging member having dampening fluid disposed thereon; forming an ink image; and transferring the ink image from the re-imageable surface of the imaging member to a printable substrate.

An exemplary digital offset printing architecture is shown in FIG. 1 described above. In embodiments, the ink compositions herein can be employed in a device such as the one described in FIG. 1.

In embodiments, a process of digital offset printing herein comprises applying an ink composition onto a re-imageable imaging member surface at an ink take up temperature, the re-imageable imaging member having dampening fluid disposed thereon; forming an ink image; transferring the ink image from the re-imageable surface of the imaging member to a printable substrate at an ink transfer temperature; wherein the ink composition comprises at least one component selected from the group consisting of a curable monomer and a curable oligomer; an optional dispersant; an optional photoinitiator; and at least one non-radiation curable additive, wherein the non-radiation curable additive is a detergent or an emulsifying agent, or wherein the non-radiation curable additive functions as a detergent or emulsifying agent when in the presence of a cleaning fluid, and wherein the non-radiation curable additive is a solid at a temperature of from about 20° C. to about 40° C. In embodiments, applying the ink composition comprises applying the ink composition using an anilox delivery system. In embodiment, the non-radiation curable additive functions as a detergent or emulsifying agent when in the present of a cleaning fluid, and wherein the cleaning fluid comprises a cleaning fluid of a cleaning system in a digital offset printing device. In embodiments, the cleaning fluid comprises water or a combination of water and surfactant.

Curing of the ink can be effected by exposure of the ink image to actinic radiation at any desired or effective wavelength, in embodiments from about 200 nanometers to about 480 nanometers, although the wavelength can be outside of this range. Exposure to actinic radiation can be for any desired or effective period of time, in embodiments for about 0.2 second to about 30 seconds, or from about 1 second to 15 seconds, although the exposure period can be outside of these ranges. By curing is meant that the curable compounds in the ink undergo an increase in molecular weight upon exposure to actinic radiation, such as (but not limited to) crosslinking, chain lengthening, or the like.

The printed substrate can be cured by exposure to radiation, in embodiments ultraviolet radiation, at any point in the fabrication process resulting in robust prints.

Any suitable substrate, recording sheet, or removable support, stage, platform, and the like, can be employed for depositing the ink compositions herein, including plain papers such as XEROX® 4024 papers, XEROX® Image Series papers, Courtland 4024 DP paper, ruled notebook paper, bond paper, silica coated papers such as Sharp Company silica coated paper, JuJo paper, HAMMERMILL LASERPRINT® paper, and the like, glossy coated papers such as XEROX® Digital Color Gloss, Sappi Warren Papers LUSTROGLOSS®, and the like, transparency materials, fabrics, textile products, plastics, polymeric films, glass, glass plate, inorganic substrates such as metals and wood, as well as meltable or dissolvable substrates, such as waxes or salts, in the case of removable supports for free standing objects, and the like. In certain embodiments, the substrate is selected from the group consisting of paper, plastic, folded paperboard, Kraft paper, and metal.

EXAMPLES

The following Examples are being submitted to further define various species of the present disclosure. These Examples are intended to be illustrative only and are not intended to limit the scope of the present disclosure. Also, parts and percentages are by weight unless otherwise indicated.

The non-radiation curable detergent or emulsifying agent additives herein themselves or the properties they impart while in an ink (such as surface wetting, etc.) do not negatively affect the quality of the fluorosilicone blanket when the ink comes into contact with it. The miscibility of a given additive in the DALI ink is one of the key properties that help ensure the continued stability of the ink so that when the ink is engaged with the blanket while in a pigmented ink, there is no dispersion fall-out, separation or other degraded state of the ink that could otherwise negatively damage the blanket or at least affect the surface properties of the blanket. Hence, solubility studies of the various additives used in the ink were performed.

A DALI ink base was prepared comprising a monomer and oligomers, but devoid of pigment, clay, dispersant, photoinitiators and stabilizer. More specifically, the prepared, mixed base consisted of: as parts by weight, 16 parts Sartomer CN294E® (a tetrafunctional acrylated polyester oligomer), 2 parts Sartomer CN9014® (a hydrophobic aliphatic urethane acrylate oligomer) and 1 part Sartomer SR-501® (propoxylated (6) trimethylolpropane triacrylate). Approximately 5 grams of the clear base was placed in an aluminum dish equipped with a small stirrer bar and was allowed to stir on a hot plate set to about 85° C. About 0.2 grams (about 4 weight percent) of an additive was added to the slowly stirring DALI base. The mixture was allowed to stir for 20 minutes. Any change in color was noted. It was obvious that for some additives, either due to the nature of an additive's chemical composition or molecular weight effect, it did not readily dissolve or melt into the DALI base. Extending the mixing time further for those additives that did not readily solubilize in the DALI ink base did not change the solubility outcome. After mixing, the aluminum dish containing the DALI materials was set aside on a room temperature surface where the solubility properties were re-examined 2 hours later and after overnight (about 18 hours). The solubility results are summarized in Table 2.

Tables 1a, 1b, and 1c include examples of non-radiation curable detergent or emulsifying agent additives with a range in polarities, melting points, molecular weights, etc. Due to the complex nature of the pigment-clay-component interactions in certain DALI inks, it is not obvious how soluble, miscible or compatible a given additive is until it is tested. It is also possible that some additives, despite their limited or non-solubility in DALI ink base at room temperature could still interact favorably with the pigment and clay found in certain DALI CMYK (cyan, magenta, yellow, and black) inks. Hence, a first pigment/clay dispersion could be formed without a non-radiation curable detergent or emulsifying agent additive of the present disclosure, processed to some extent whereupon a second dispersion can be formed comprising a non-radiation curable detergent or emulsifying agent as described herein to the first dispersion and processed further to some extent including mixing by impeller, high shear mixing such as with a high-vane impeller and milling such as with a 3-roll mill finally yielding a third dispersion with improved properties, such as ink transfer efficiency from blanket to receiving substrate and/or ink residuals cleanability.

TABLE 1a

| Additive | Component | Vendor | CAS No. | Catalog Number | Mw | Mn |
|---|---|---|---|---|---|---|
| A1 | Polyethylene glycol | Sigma-Aldrich | 25322-68-3 | 202436-250G | n/a | 1500 |
| A2 | Poly(ethylene-co-vinyl acetate) | Sigma-Aldrich | 24937-78-8 | 340502-250G | n/a | n/a |
| A3 | Poly(vinyl alcohol) | Sigma-Aldrich | 9002-89-5 | 18,933-2 | 14000 | n/a |
| A4 | Polyvinylpyrrolidone | Sigma-Aldrich | 9003-39-8 | 234257-100G | 29000 | n/a |
| A5 | Polyethylene glycol | Sigma-Aldrich | 25322-68-3 | 309028-250G | 10000 | n/a |
| A6 | Behenyl acrylate | Sartomer | 18299-85-9 | CD587 | n/a | n/a |
| A7 | Polyethylene glycol | Sigma-Aldrich | 25322-68-3 | 373001-250G | n/a | 4600 |
| A8 | Poly(ethylene terephthalate) | Scientific Polymer Products | 25038-59-9 | 138 | n/a | n/a |
| A9 | Poly(vinyl acetate) | Sigma-Aldrich | 9003-20-7 | 43,043-9 | 12800 | n/a |
| A10 | 1,6-hexanediol | Sigma-Aldrich | 629-11-8 | H11807-500G | n/a | n/a |
| A11 | NF Emulsifying Wax #109P (Cetearyl Alcohol, Polysorbate 60) | Koster-Keunen | 67762-27-0, 9005-67-8 | Wax #109P | n/a | n/a |

TABLE 1b

| Additive | Component | Vendor | CAS No. | Catalog Number | Mw | Mn |
|---|---|---|---|---|---|---|
| A12 | Kester ® Wax K-59 (stearyl stearate) | Koster-Keunen | 2778-96-3 | Wax# 129P | n/a | n/a |
| A13 | 1,8-octanediol | Sigma-Aldrich | 112-92-5 | 258768-100G | n/a | n/a |
| A14 | 1,2-tetradecanediol | Sigma-Aldrich | 21129-09-9 | 26,029-0 | n/a | n/a |
| A15 | 1,10-decanediol | Sigma-Aldrich | 112-47-0 | D1203-100G | n/a | n/a |
| A16 | Brij ® L23, (Brij ® 35 or Polyoxyethylene (23) lauryl ether) | Sigma-Aldrich | 9002-92-0 | 16005-250G | 4670 | n/a |
| A17 | Brij ® S100, (Polyoxyethylene (100) stearyl ether) | Sigma-Aldrich | 9005-00-9 | 466387-250G | 1152 | n/a |
| A18 | Brij ® S20, (Polyoxyethylene (100) stearyl ether) | Sigma-Aldrich | 9005-00-9 | P4019 | n/a | 1152 |
| A19 | Pluronic ® F127 | BASF | 9003-11-6 | | n/a | 12600 |
| A20 | Poloxamer 188 | Alfa-Aesar | 9003-11-6 | J66087 | n/a | 8400 |
| A21 | Tetronic ® 1307 | BASF | | | n/a | 18000 |
| A22 | Polycaprolactone diol | Sigma-Aldrich | 36890-68-3 | 18,942-1 | n/a | 2000 |

TABLE 1c

| Additive | Component | Vendor | CAS No. | Catalog Number | Mw | Mn |
|---|---|---|---|---|---|---|
| A23 | Polycaprolactone | Happy Wire Dog | 24980-41-4 | Instamorph ® Polycaprolactone | high | high |
| A24 | behenyl behenate | Koster-Keunen | 17671-27-1 | Kester ® Wax K-72, Wax #131P | n/a | n/a |
| A25 | stearyl behenate, cetyl stearate, stearyl stearate | Koster-Keunen | 24271-12-3, 1190-63-2, 2778-96-3 | Kester ® Wax K-62, Wax #130P | n/a | n/a |
| A26 | polycaprolactone-block-polytetrahydrofuran-block-polycaprolactone | Perstorp | 31831-53-5 | CAPA 2302A | n/a | 3000 |
| A27 | Polycaprolactone | Perstorp | 24980-41-4 | CAPA 6250 | n/a | 25000 |
| A28 | Lanco ™ Flow P30 (modified castor wax) | Lubrizol | n/a | Lanco ® Flow P30 | n/a | n/a |
| A29 | Emulsifier U Flakes | Bayer | n/a | Emulsifier U Flakes | n/a | n/a |
| A30 | Sorbitan monostearate | Croda | 1338-41-6 | SPAN ® 60 | n/a | n/a |
| A31 | Sorbitan monopalmitate | Croda | 26266-57-9 | SPAN ® 40 | n/a | n/a |
| A32 | cetyl alcohol | Croda | 36653-82-4 | Crodacol ™ C70 | n/a | n/a |
| A33 | stearyl alcohol | Croda | 112-92-5 | Crodacol ™ S95 | n/a | n/a |
| A34 | cetostearyl alcohol | Croda | 67762-30-5 | Crodacol ™ CS90 | n/a | n/a |

TABLE 2a

| | | | | | Solubility in DALI ink base at | | |
|---|---|---|---|---|---|---|---|
| Additive | Component | Vendor | CAS No. | Catalog Number | 85° C. | RT after 2 hours | RT after 18 hours |
| A1 | Polyethylene glycol | Sigma-Aldrich | 25322-68-3 | 202436-250G | yes | yes | yes |
| A2 | no Poly(ethylene-co-vinyl acetate) | Sigma-Aldrich | 24937-78-8 | 340502-250G | no | no | no |
| A3 | Poly(vinyl alcohol) | Sigma-Aldrich | 9002-89-5 | 18,933-2 | no | no | no |
| A4 | Polyvinylpyrrolidone | Sigma-Aldrich | 9003-39-8 | 234257-100G | no | no | no |
| A5 | Polyethylene glycol | Sigma-Aldrich | 25322-68-3 | 309028-250G | yes | yes | yes |
| A6 | Behenyl acrylate | Sartomer | 18299-85-9 | CD587 | yes | sl. ppte | sl. ppte |
| A7 | Polyethylene glycol | Sigma-Aldrich | 25322-68-3 | 373001-250G | yes | yes | yes |
| A8 | Poly(ethylene terephthalate) | Scientific Polymer Products | 25038-59-9 | 138 | no | no | no |
| A9 | Poly(vinyl acetate) | Sigma-Aldrich | 9003-20-7 | 43,043-9 | no | no | no |
| A10 | 1,6-hexanediol | Sigma-Aldrich | 629-11-8 | H11807-500G | yes | yes | yes |

TABLE 2a-continued

| Additive | Component | Vendor | CAS No. | Catalog Number | Solubility in DALI ink base at 85° C. | RT after 2 hours | RT after 18 hours |
|---|---|---|---|---|---|---|---|
| A11 | NF Emulsifying Wax #109P (Cetearyl Alcohol, Polysorbate 60) | Koster-Keunen | 67762-27-0, 9005-67-8 | Wax# 109P | yes | yes | yes |

TABLE 2b

| Additive | Component | Vendor | CAS No. | Catalog Number | Solubility in DALI ink base at 85° C. | RT after 2 hours | RT after 18 hours |
|---|---|---|---|---|---|---|---|
| A12 | Kester ® Wax K-59 (stearyl stearate) | Koster-Keunen | 2778-96-3 | Wax# 129P | yes | yes | yes |
| A13 | 1,8-octanediol | Sigma-Aldrich | 112-92-5 | 258768-100G | yes | yes | yes |
| A14 | 1,2-tetradecanediol | Sigma-Aldrich | 21129-09-9 | 26,029-0 | yes | yes | yes |
| A15 | 1,10-decanediol | Sigma-Aldrich | 112-47-0 | D1203-100G | yes | yes | yes |
| A16 | Brij ® L23, (Brij ® 35 or Polyoxyethylene (23) lauryl ether) | Sigma-Aldrich | 9002-92-0 | 16005-250G | yes | yes | yes |
| A17 | Brij ® S100, (Polyoxyethylene (100) stearyl ether) | Sigma-Aldrich | 9005-00-9 | 466387-250G | yes | yes | yes |
| A18 | Brij ® S20, (Polyoxyethylene (100) stearyl ether) | Sigma-Aldrich | 9005-00-9 | P4019 | yes | yes | yes |
| A19 | Pluronic ® F127 | BASF | 9003-11-6 | Pluronic ® F127 | yes | yes | yes |
| A20 | Poloxamer 188 | Alfa-Aesar | 9003-11-6 | J66087 | yes | yes | yes |
| A21 | Tetronic ® 1307 | BASF | | | yes | yes | yes |
| A22 | Polycaprolactone diol | Sigma-Aldrich | 36890-68-3 | 18,942-1 | yes | yes | yes |

TABLE 2c

| Additive | Component | Vendor | CAS No. | Catalog Number | Solubility in DALI ink base at 85° C. | RT after 2 hours | RT after 18 hours |
|---|---|---|---|---|---|---|---|
| A23 | Polycaprolactone | Happy Wire Dog | 24980-41-4 | Instamorph ® Polycaprolactone | yes | yes | yes |
| A24 | behenyl behenate | Koster-Keunen | 17671-27-1 | Kester ® Wax K-72, Wax #131P | yes | yes | yes |
| A25 | stearyl behenate, cetyl stearate, stearyl stearate | Koster-Keunen | 24271-12-3, 1190-63-2, 2778-96-3 | Kester ® Wax K-62, Wax #130P | yes | | |
| A26 | polycaprolactone-block-polytetrahydrofuran-block-polycaprolactone | Perstorp | 31831-53-5 | CAPA ™ 2302A | yes | yes | yes |
| A27 | Polycaprolactone | Perstorp | 24980-41-4 | CAPA ™ 6250 | yes | yes | yes |
| A28 | Lanco ® Flow P30 (modified castor wax) | Lubrizol | n/a | Lanco ® Flow P30 | yes | sl. ppte | sl. ppte |
| A29 | Emulsifier U Flakes | Bayer | n/a | Emulsifier U Flakes | yes | sl. ppte | sl. ppte |
| A30 | Sorbitan monostearate | Croda | 1338-41-6 | SPAN ® 60 | yes | yes | yes |
| A31 | Sorbitan monopalmitate | Croda | 26266-57-9 | SPAN ® 40 | yes | yes | yes |
| A32 | cetyl alcohol | Croda | 36653-82-4 | Crodacol ® C70 | yes | yes | yes |
| A33 | stearyl alcohol | Croda | 112-92-5 | Crodacol ® S95 | yes | yes | yes |
| A34 | cetostearyl alcohol | Croda | 67762-30-5 | Crodacol ® CS90 | yes | yes | yes |

In Tables 2a, 2b, and 2c, R.T. is room temperature of from about 20 to about 25° C.

A pigmented ink without additive (formulated in such a way to accommodate the addition of an additive) was first prepared as a stock ink. Example preparations include addition of the additive to the mixing DALI ink base prior to the addition of pigment and clay. The following examples illustrate the additives and ink preparation processes used but do not serve to limit the kind of additives and processes used in this disclosed concept.

Comparative Example 1

Preparation of concentrate (without additive). Based on a 1,500 gram total scale of preparation of the ink, the first set of ink base components (including the dispersant, monomer, oligomer and thermal stabilizer) were added in a 3 Liter jacketed stainless steel vessel. The vessel was equipped with connecting lines to a circulating bath, a thermocouple and stirrer apparatus available from IKA® with an anchor impeller. The components in the vessel were stirred at about 200 RPM (revolutions per minute) for about 30 minutes at about 80° C. Then the second set of ink base components, (the photoinitators), were added slowly with stirring at about 80° C. which continued for about another hour. With the vehicle base components solubilized, the given quantity of colored pigment was added to the system where more vigorous stirring occurred but not to the point where air was being entrained into the system. The pigmented mixture was allowed to stir for about 30 minutes at about 400 RPM at which point the clay was added slowly to the pigmented mixture at reduced RPM but then re-stirred for about another 15 minutes at about 400 RPM. The vessel containing the mixed components was transferred to a high speed shearing mill available from the Hockmeyer Equipment Corporation equipped with a 40 millimeter diameter high shear Cowles blade which was then stirred at 5,300 RPM for about an hour. The thoroughly mixed component mixture was then discharged into glass jars.

Comparative Example 2

Preparation of ink without additive. Based on a 300 gram total scale of preparation of the ink, the first set of ink base components (including the dispersant, monomer, oligomer and thermal stabilizer) were added in a 1 Liter jacketed stainless steel vessel. The vessel was equipped with connecting lines to a circulating bath, a thermocouple and stirrer apparatus available from IKA® with an anchor impeller. The components in the vessel were stirred at about 200 RPM for about 30 minutes at about 80° C. Then the second set of ink base components, (the photoinitators), were added slowly with stirring at about 80° C. which continued for about another hour. With the vehicle base components solubilized, the given quantity of colored pigment was added to the system where more vigorous stirring occurred but not to the point where air was being entrained into the system. The pigmented mixture was allowed to stir for about 30 minutes at about 400 RPM at which point the clay was added slowly to the pigmented mixture at reduced RPM but then re-stirred for about another 15 minutes at about 400 RPM. The vessel containing the mixed components was transferred to a high speed shearing mill available from the Hockmeyer Equipment Corporation equipped with a 40 mm diameter high shear Cowles blade which was then stirred at 5300 RPM for about an hour. The thoroughly mixed component mixture was then qualitatively transferred to a 3-roll mill apparatus manufactured by Kent Machine Works where the material composite paste was passed through the 3-roll mill at an input apron roll speed of 200 RPM for the first and only pass. The thoroughly mixed component mixture was then discharged into an amber brown glass bottle.

Example 3

Preparation of ink with polyethylene glycol additive. A portion of the Comparative Example 1 preparation was further diluted with Additive A1 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 4

Preparation of ink with polyethylene glycol additive. A portion of the Comparative Example 1 preparation was further diluted with Additive A5 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 5

Preparation of ink with polyethylene glycol additive. A portion of the Comparative Example 1 preparation was further diluted with Additive A7 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 6

Preparation of ink with diol additive. A portion of the Comparative Example 1 preparation was further diluted with Additive A10 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 7

Preparation of ink with emulsifying wax additive. A portion of the Comparative Example 1 preparation was further diluted with Additive A11 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 8

Preparation of ink with alkyl alkenate additive. A portion of the Comparative Example 1 preparation was further diluted with Additive A12 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 9

Preparation of ink with diol additive. A portion of the Comparative Example 1 preparation was further diluted with Additive A13 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 10

Preparation of ink with diol additive. A portion of the Comparative Example 1 preparation was further diluted with Additive A14 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 11

Preparation of ink with diol additive. A portion of the Comparative Example 1 preparation was further diluted with Additive A15 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 12

Preparation of ink with polyoxyethylene alkyl ether additive. A portion of the Comparative Example 1 preparation was further diluted with Additive A16 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 13

Preparation of ink with polyoxyethylene alkyl ether additive. A portion of the Comparative Example 1 preparation was further diluted with Additive A17 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 14

Preparation of ink with polyoxyethylene alkyl ether additive. A portion of the Comparative Example 1 preparation was further diluted with Additive A18 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 15

Preparation of ink with polyol additive. A portion of the Comparative Example 1 preparation was further diluted with Additive A19 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 16

Preparation of ink with polyol additive. A portion of the Comparative Example 1 preparation was further diluted with Additive A20 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 17

Preparation of ink with polyol additive. A portion of the Comparative Example 1 preparation was further diluted with Additive A21 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 18

Preparation of ink with polycaprolactone diol additive. A portion of the Comparative Example 1 preparation was further diluted with Additive A22 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 19

Preparation of ink with polycaprolactone additive. A portion of the Comparative Example 1 preparation was further diluted with Additive A23 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 20

Preparation of ink with polycaprolactone additive. A portion of the Comparative Example 1 preparation was further diluted with Additive A23 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 21

Preparation of ink with alkyl alkenate additive. A portion of the Comparative Example 1 preparation was further diluted with Additive A24 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 22

Preparation of ink with alkyl alkenate additives blend. A portion of the Comparative Example 1 preparation was further diluted with Additive A25 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 23

Preparation of ink with polycaprolactone-block-polytetrahydrofuran-block-polycaprolactone Additive. A portion of the Comparative Example 1 preparation was further diluted with Additive A26 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 24

Preparation of ink with polycaprolactone additive. A portion of the Comparative Example 1 preparation was further diluted with Additive A27 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 25

Preparation of ink with modified castor wax additive. A portion of the Comparative Example 1 preparation was further diluted with Additive A28 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

Example 26

Preparation of ink with emulsifying wax additive. A portion of the Comparative Example 1 preparation was further diluted with Additive A29 such as to realize the composition found in Table 3. The thoroughly mixed component mixture was then qualitatively transferred to a 3-roll mill apparatus manufactured by Kent Machine Works where the material composite paste was passed through the 3-roll mill first at an input apron roll speed of 200 RPM for the first and only pass.

TABLE 3

Ink Formulation Examples and Comparative Examples as Weight Percent

| Component | Comparative Example 1 | Comparative Example 2 | Example 2 | Examples 3, 4, 5, 6, 7, 8, 9, 10, 11, 12, 13, 14, 15, 16, 17, 20, 21, 22, 23, 24 | Examples 18, 25, 26 | Example 19 |
|---|---|---|---|---|---|---|
| Clariant C.I. Pigment Red 57:1 | 15.57 | 15.00 | 15.00 | 15.00 | 15.00 | 15.00 |
| Southern Clay Products Claytone ® HY | 2.08 | 2.00 | 2.00 | 2.00 | 2.00 | 2.00 |
| Lubrizol Solsperse ™ J-180 | 6.23 | 6.00 | 6.00 | 6.00 | 6.00 | 6.00 |
| Sartomer SR-501 | 4.20 | 4.28 | 4.05 | 4.05 | 4.22 | 4.29 |
| Sartomer CN294E | 62.15 | 63.34 | 59.91 | 59.92 | 62.49 | 62.87 |
| BASF Irgacure ® 379 | 2.08 | 2.00 | 1.92 | 2.00 | 2.00 | 2.00 |
| BASF Irgacure ® 819 | 2.50 | 2.40 | 2.30 | 2.40 | 2.40 | 2.40 |
| BASF Irgacure ® 184 | 0.50 | 3.50 | 3.36 | 3.50 | 3.50 | 3.50 |
| Lamberti S.p.A. Esacure ® KIP 150 | 3.65 | 0.48 | 0.46 | 0.48 | 0.48 | 0.48 |
| Sartomer CN3216 | 1.04 | 1.00 | 1.00 | 1.00 | 1.00 | 1.00 |
| Additive | 0 | 0 | 4.00 | 3.65 | 0.91 | 0.46 |
| Total | 100 | 100 | 100 | 100 | 100 | 100 |

The rheologies of the Example inks were determined using an RFS-3 controlled-strain rheometer from Rheometric Scientific (now TA Instruments) at 45° C. equipped with a 25 millimeter (mm) parallel plate assembly and run using dynamic mode to generate an ink rheology profile from 0.1 to 100 rad/s. The rheologies of the inks were also determined using a DHR-2 controlled-stress/strain rheometer TA Instruments at 25° C. equipped with a 25 mm parallel plate assembly and run using dynamic mode to generate an ink rheology profile from 0.1 to 100 rad/s. A summary of the results can be found in Table 4.

The tack profiles of the Example inks were determined using an Inkometer tack meter from Thwing-Albert. The Inkometer was equilibrated at 32° C. where 1.32 milliliters of ink were placed on the distribution roller with the settings of the test allowing the ink to spread to the other 2 rolls of the instrument before the roller RPM increased to 1200 RPM for 10 minutes where tack measurements were taken over 20 second intervals for that 10 minute period. A summary of the tack results can be found in Table 4.

TABLE 4

| Example Ink | Complex Viscosity @ 100 rad/s at 45 C., mPa·s | Complex Viscosity @ 1 rad/s at 25 C., mPa·s | Mean tack from 60 to 600 s, g-m | Tack at 60 s, g-m |
|---|---|---|---|---|
| Comparative Example 1 | 3.18E+04 | 2.55E+05 | 46.3 | 55.2 |
| Comparative Example 2 | 3.86E+04 | 2.07E+05 | 41.2 | 47.7 |
| Example 3 | 2.04E+04 | 2.84E+05 | 33.9 | 40.0 |
| Example 4 | 6.43E+04 | 8.27E+05 | 48.2 | 57.1 |
| Example 5 | 4.45E+04 | 6.93E+05 | 46.0 | 53.8 |
| Example 6 | 1.42E+05 | 1.27E+06 | 31.7 | 36.6 |
| Example 7 | 2.81E+04 | 8.53E+04 | 34.4 | 38.6 |
| Example 8 | 6.02E+04 | 1.10E+05 | 43.9 | 53.3 |
| Example 9 | 1.02E+05 | 2.10E+05 | 36.9 | 43.2 |
| Example 10 | 1.77E+05 | 4.50E+05 | 37.8 | 44.6 |
| Example 11 | 7.75E+04 | 2.73E+05 | 42.0 | 49.4 |
| Example 12 | 2.16E+04 | 1.47E+05 | 34.5 | 41.1 |
| Example 13 | 2.35E+04 | 4.55E+05 | 40.3 | 48.4 |
| Example 14 | 2.29E+04 | 1.58E+05 | 32.6 | 39.2 |
| Example 15 | 2.76E+04 | 4.55E+05 | 34.6 | 39.0 |
| Example 16 | 2.64E+04 | 1.35E+05 | 40.6 | 45.3 |
| Example 17 | 2.94E+04 | 4.73E+05 | 37.2 | 42.4 |
| Example 18 | 2.11E+04 | 4.78E+05 | 36.3 | 41.6 |
| Example 19 | 3.64E+04 | 4.03E+05 | 35.3 | 61.2 |
| Example 20 | 2.94E+04 | 2.71E+05 | 27.5 | 53.3 |
| Example 21 | 4.48E+04 | 3.36E+05 | 45.1 | 51.2 |
| Example 22 | 4.13E+04 | 3.03E+05 | 44.3 | 49.5 |
| Example 23 | 2.10E+04 | 7.43E+05 | 40.1 | 45.3 |
| Example 24 | 6.57E+04 | 1.63E+06 | 20.4 | 26.0 |
| Example 25 | 3.60E+04 | 2.80E+05 | 42.7 | 48.8 |
| Example 26 | n/a | 2.50E+05 | 42.8 | 48.9 |

Transfer of Inks onto Substrate and Radiation Curing.

A printing fixture equipped with: a fluorosilicone blanket comprising 20% by weight carbon black particles; a printing anilox roller from Impreglon Cellramic having a screen count of 1000 lines per ink (lpi); a cell volume of 2.1 billion cubic microns per square inch (BCM/cm$^2$) and a screen angle of 60 degrees; and nip rollers as a means of transferring the ink applied to the fluorosilicone blanket to the receiving substrate. Each of the inks were thus imaged from the anilox roller onto the fluorosilicone blanket and transferred onto Sterling® Ultra Gloss 80# paper at a similar optical density such that the resultant uniform visible optical densities ranged between 1.45 and 1.55 and such that the L* brightness of the transferred images were in a range suitable for 100% magenta fill after having been cured at 1 m/s using a Fusion UV Lighthammer® L6 curing station equipped with D bulb and such that the applied energy doses for UVV, UVA, UVB, and UVC bands were 119, 274, 81 and 6 mJ/cm$^2$, respectively. The print image dimensions were on the order of 5 centimeters by 10 centimeters.

Measurement of color can, for example, be characterized by CIE (Commission International de l'Eclairage) specifications, commonly referred to as CIELAB, where L*, a* and b* are the modified opponent color coordinates, which form a 3 dimensional space, with L* characterizing the lightness of a color, a* approximately characterizing the redness, and b* approximately characterizing the yellowness of a color.

Figure 2:
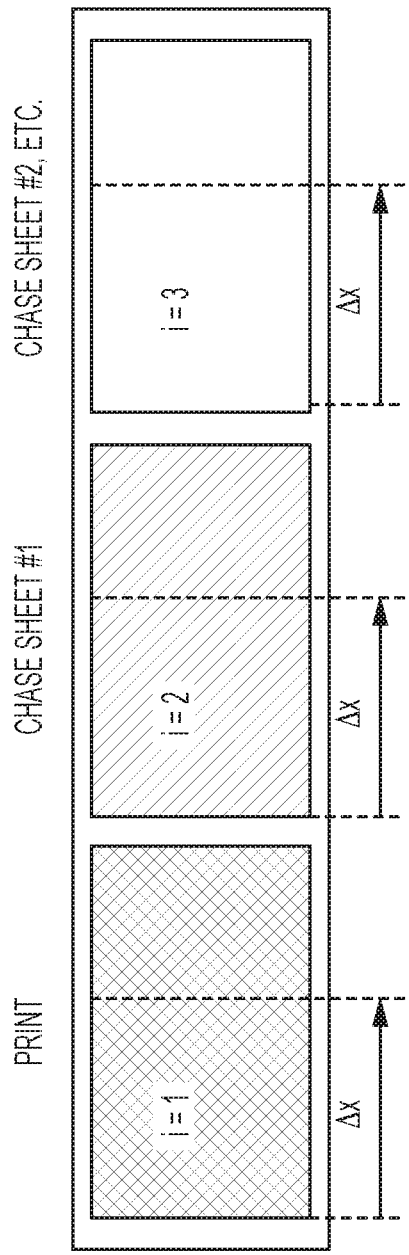
FIG. 2 is a depiction of a print and chase sheet optical density measuring scheme.

The transfer efficiency of an ink was determined by from the summation of the optical densities (O.D. or O.D.'s) of the printed page and successive chase sheets of that ink such that no more chase sheets were generated once an O.D. of less than 0.1 (not corrected with substrate) was obtained. An X-Rite 538 Spectrodensitometer was used to measure along a line perpendicular to the process direction at a distance from the edge of the print image, X, where the O.D.'s of subsequent chase sheets were also measured at the same relative distance, X. FIG. 2 is an illustration summarizing the method used to estimate transfer efficiency of the print. The basic steps comprised printing a page followed by two or more chase sheets, such as chase sheet #1, chase sheet #2, etc. The paper O.D. was subtracted from each of the print and chase sheet O.D.'s according to the following relation:

% Transfer of Print=[O.D. of Print/Summation of Print and Chase Sheet O.D.'s]×100% such that at least one chase sheet had to be generated to establish the transfer efficiency of the ink.

Cleanability Assessment of Inks.

Various surfactant-based aqueous solutions were made to assess the cleanability of the ink. The aqueous solutions included 10% by weight of each of BIOSOFT® D-40, BIO-SOFT® EC-690 and STEPOSOL® CITRI-MET available from Stepan Company. The 10 wt % surfactant solutions were made and were allowed to stir for 2 hours at room temperature at which point it was noted each of the surfactants in the solutions were completely solubilized. Table 5 summarizes some selected attributes of the surfactants available from Stepan.

TABLE 5

| Surfactant | Chemical Structure Class | % solids in water | Surface tension, dynes/cm | CMC, mg/L | Viscosity, cP |
|---|---|---|---|---|---|
| BIOSOFT ® D-40 | SODIUM DODECYLBENZENE SULFONATE | 40 | 34.1 | 815 | 867 |
| BIO-SOFT ® EC-690 | LAURYL ALCOHOL ETHOXYLATE, POE-7 | 90 | 28.7 | 10.4 | 60 |
| STEPOSOL ® CITRI-MET | PROPRIETARY bio-based 2-component system (D-limonene + non-ionic) | 51 | 31.8 | 40 | 25 |

Due to logistical restraints in assessing the cleanability of the residual ink from the blanket affixed to the printing fixture used to generate the prints, an ad hoc stress-test was developed to assess the cleanability of the ink. A film of a test ink was applied using a single-edge safety blade available from Dorco® USA, on 4 mil clear MYLAR® available from Dupont Tejin Films, such that a coated area of about 35 by 100 millimeters and an O.D. of about 2 resulted. A Puritan® Medical Products cotton tip applicator swab was dipped in a given solution for 5 seconds upon which it was dragged perpendicularly across the film at a force of about 200 grams. The length of the completely clean area was determined using a millimeter-gradated ruler. This process was performed with the surfactants in Table 5 made as 10% by weight in water as well as with de-ionized water. There were instances when some of the inks had areas inside the cleaned zone that were streaked or semi-cleaned. The lengths of only the completely cleaned areas were determined.

The above-described ad hoc test approximates an assessment of the cleaning function and ability to remove ink from an actual fluorosilicone blanket. The ad hoc test stresses the ink cleanability function in several ways: the clear MYLAR® substrate has a much higher surface energy relative to the fluorosilicone blanket (about 42 versus about 20 or less dynes/cm) resulting in a substantial increase of adhesion of the ink to the clear MYLAR®; the ink film thickness of the ink on the clear MYLAR® is thicker than what would be used to image a magenta ink with a desired O.D. range of about 1.3 to about 1.7 in the actual DALI imaging process; and the total area coverage of the ink for this ad hoc test is much higher than would be the case for any residual ink left on the fluorosilicone blanket. Therefore, any improvement in the cleanability function in the ad hoc stress is expected to be easily be realized for a printing process that utilizes a fluorosilicone imaging blanket and that has only residual ink left on it with an intended imaging O.D. range of about 1.3 to about 1.7. The ink cleanability results are summarized in Table 6.

TABLE 6

| Example | % Transfer of Print | BIOSOFT® D-40 | BIOSOFT® EC-690 | STEPOSOL® CITRI-MET | DIW |
|---|---|---|---|---|---|
| Comparative Example 2 | 89.7 | 5 | 8 | 3 | 0 |
| Example 4 | 96.2 | 35 | 30 | 35 | 10 |
| Example 13 | 94.4 | 10 | 20 | 10 | 5 |
| Example 21 | 95.9 | 10 | 12 | 15 | 2 |
| Example 23 | 87.7 | 35 | 35 | 35 | 6 |
| Example 5 | n/a | 8 | 15 | 15 | 4 |
| Example 8 | n/a | 30 | 26 | 14 | 4 |
| Example 7 | n/a | 10 | 8 | 15 | 4 |
| Example 12 | n/a | 14 | 12 | 10 | 4 |
| Example 14 | n/a | 28 | 26 | 32 | 2 |
| Example 15 | n/a | 14 | 26 | 34 | 1 |
| Example 16 | n/a | 24 | 28 | 28 | 9 |
| Example 18 | n/a | 17 | 23 | 14 | 4 |
| Example 24 | n/a | 9 | 15 | 7 | 2 |
| Example 25 | n/a | 14 | 8 | 10 | 4 |
| Example 26 | n/a | 11 | 8 | 14 | 3 |

Figure 3:
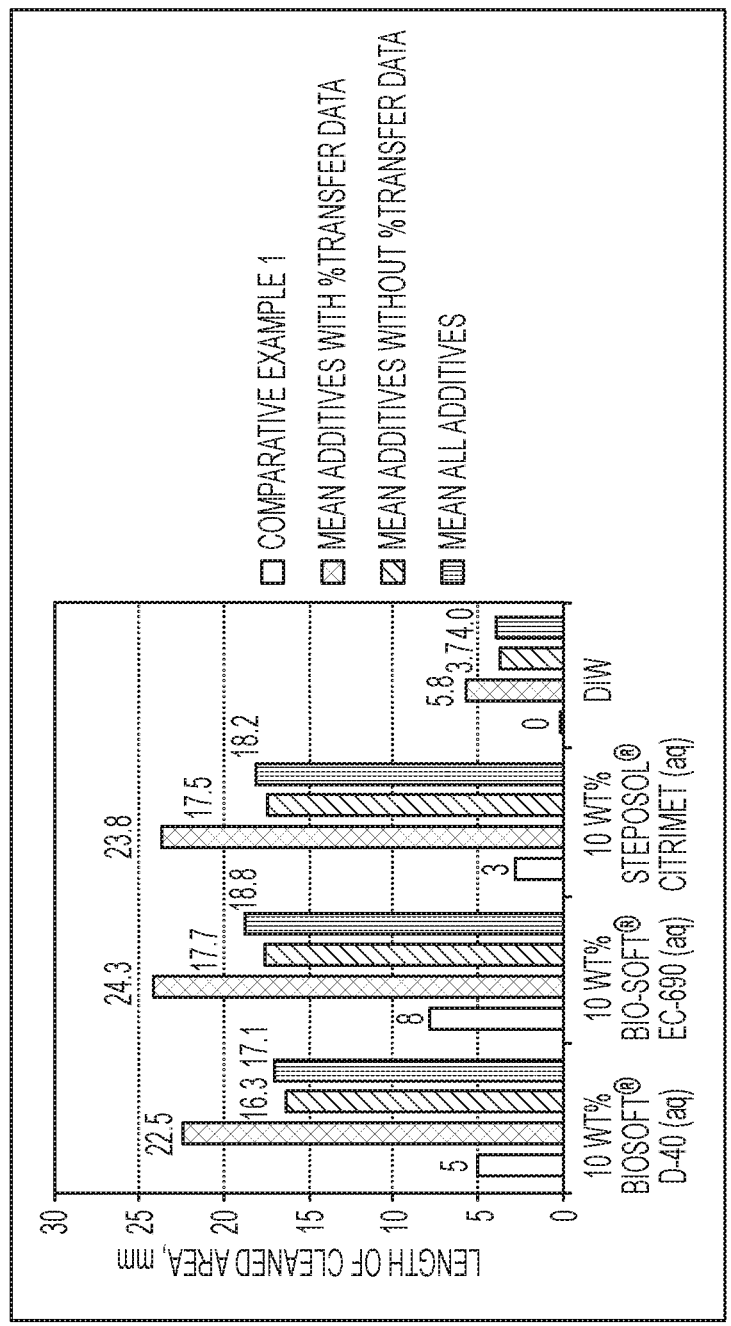
FIG. 3 is a graph showing ink cleanability results as length of clear area (y-axis, millimeters) versus cleaning system (x-axis, cleaning solution).

FIG. 3 shows the advantaged cleanability results of the Example Inks over the Comparative Example ink. The data was sorted by calculating the mean lengths of cleaned area from the ad hoc cleaning test for Example Inks that also had % transfer data of print determined, for those Example inks that did not have the % transfer data of print determined and for all of the Example inks that had their cleanability assessed. The improved averaged cleanability of the Example Inks was on the order of about 3 to 7 times that of the Comparative Example ink depending on the cleaning system used. On average, the 10% aqueous solutions of each of BIOSOFT® D-40, BIO-SOFT® EC-690 and STEPOSOL® CITRI-MET had similar ink cleanability function among the data set categories as displayed in FIG. 3.

Example Inks 4, 13, 21 and 23 have a desirably high % transfer of the print from the fluorosilicone blanket to the Sterling® Ultra Gloss 80# paper and also have a desirably high ink cleanability aspect from clear MYLAR®. The other Example inks also display better cleanability, often much better cleanability, than the Comparative Example 2 ink (itself having relatively poor cleanability) comprising no additive as per the present disclosure. The results also show the efficacy of the cleaning solvent, when comprised with a surfactant, in cleaning the ink off the clear MYLAR® surface compared to using de-ionized water alone. It is postulated that a positive synergistic interaction can occur with certain inks comprising additives of the present disclosure and the surfactant/water used to clean the inks. For those cleaning results of inks in Table 6 with high removal amounts of ink from the clear MYLAR®, for example, with lengths of cleaned areas exceeding about 15 millimeters, there is no obvious predictability in the ink cleaning efficacy based upon the structure(s) of the additive in the ink and the structure(s) of the surfactant used in the solution to clean the ink showing the non-obviousness of the present embodiments. Moreover, there is no apparent relationship between the low shear viscosity at 25° C. and the cleanability of the Comparative Example and Example inks. In fact, there are numerous Example inks that have higher low shear viscosity at 25° C. that have much higher cleanability compared to the Comparative Example ink without the present additive.

Thus, in embodiments, compositions of radiation-curable inks suitable for DALI (including UV curable inks) applications, comprising the presently disclosed non-radiation-curable additives afford higher transfer of ink from blanket to receiving substrate and much-improved cleanability with water and safe surfactant/water solutions.

As far as can be discerned, most of the additives used in commercial inks and in the public domain are proprietary additives used for many specific purposes, some of which include: to modify the dispersion or ink rheology; to extend the dispersion or ink's polarity; to aid in pigment dispersion; provide low foaming in pigment dispersion or ink preparation; improve the surface wetting properties of the ink; to act as formulation stabilizers; and the like.

Additives are also formulated in inks to impart certain desired print characteristics such as for: an improved adhesion of print to a substrate, as a functional barrier resulting in improved water, oil and solvent repellency; improved abrasion resistance; controlled slip and release properties; control of mechanical properties; recoatability options, low/no image offset; control of desired gloss; improved optical clarity; anti-curl and anti-pick-off features; improved resistance to UV and visible light degradation; and the like.

The chemical classes of the present embodiments, which include room temperature-solid-based additives having alcohol, ester, ether and alkoxylate functionalities, with specific example additives formulated in the Example Inks, are not known to be formulated in lower polarity UV offset inks. The benefits of improved ink transfer and cleanability of inks formulated with the additives of the present embodiments are also not found in the prior art.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. An ink composition for use in digital offset printing, comprising:
   at least one component selected from the group consisting of a curable monomer and a curable oligomer;
   an optional dispersant;
   an optional photoinitiator; and
   at least one non-radiation curable additive,
   wherein the non-radiation curable additive is a detergent or an emulsifying agent, or wherein the non-radiation curable additive functions as a detergent or emulsifying agent when in the presence of a cleaning fluid,
   wherein the non-radiation curable additive is a solid at a temperature of from about 20° C. to about 40° C., and
   wherein the non-radiation curable additive is behenyl behenate or polycaprolactone-block-polytetrahydrofuran-block-polycaprolactone.

2. The ink composition of claim 1, wherein the at least one non-radiation curable additive is a solid at a temperature of from about 20° C. to about 30° C.

3. The ink composition of claim 1, wherein the at least one non-radiation curable additive is behenyl behenate.

4. The ink composition of claim 1, wherein the at least one non-radiation curable additive is polycaprolactone-block-polytetrahydrofuran-block-polycaprolactone.

5. The ink composition of claim 1, wherein the at least one non-radiation curable additive is present in the ink composition in an amount of from about 1 to about 6 percent by weight based upon the total weight of the ink composition.

6. The ink composition of claim 1, wherein the non-radiation curable additive functions as a detergent or emulsifying agent when in the presence of a cleaning fluid, and wherein the cleaning fluid comprises a cleaning fluid of a cleaning subsystem in a digital offset printing device.

7. The ink composition of claim 1, wherein the cleaning fluid comprises water or a combination of water and surfactant.

8. The ink composition of claim 1, wherein the at least one component selected from the group consisting of a curable monomer and a curable oligomer is a component selected from the group consisting of acrylated polyesters, acrylated polyethers, acrylated epoxies, urethane acrylates, and pentaerythritol tetraacrylate, and combinations thereof.

9. The ink composition of claim 1, wherein the at least one component selected from the group consisting of a curable monomer and a curable oligomer is a component selected from the group consisting of a tetrafunctional polyester acrylate oligomer, a propoxylated trimethylolpropane triacrylate monomer, and combinations thereof.

10. The ink composition of claim 1, further comprising: a clay.

11. A process of digital offset printing with a digital offset printing device, the process comprising:
    applying an ink composition onto a re-imageable imaging member surface at an ink take up temperature, the re-imageable imaging member having dampening fluid disposed thereon;
    forming an ink image;
    transferring the ink image from the re-imageable surface of the imaging member to a printable substrate at an ink transfer temperature;
    wherein the ink composition comprises:
    at least one component selected from the group consisting of a curable monomer and a curable oligomer;
    an optional dispersant;
    an optional photoinitiator; and
    at least one non-radiation curable additive,
    wherein the non-radiation curable additive is a detergent or an emulsifying agent, or wherein the non-radiation curable additive functions as a detergent or emulsifying agent when in the presence of a cleaning fluid,
    wherein the non-radiation curable additive is a solid at a temperature of from about 20° C. to about 40° C.,
    wherein the non-radiation curable additive is behenyl behenate or polycaprolactone-block-polytetrahydrofuran-block-polycaprolactone.

12. The process of claim 11, wherein the at least one non-radiation curable additive is a solid at a temperature of from about 20° C. to about 30° C.

13. The process of claim 11, wherein the at least one non-radiation curable additive is behenyl behenate.

14. The process of claim 11, wherein the at least one non-radiation curable additive is polycaprolactone-block-polytetrahydrofuran-block-polycaprolactone.

15. The process of claim 11, wherein the non-radiation curable additive functions as a detergent or emulsifying agent when in the presence of a cleaning fluid, and wherein the cleaning fluid comprises a cleaning fluid of a cleaning subsystem in the digital offset printing device.

16. The process of claim 11, wherein the cleaning fluid comprises water or a combination of water and surfactant.

17. The process of claim 11, wherein applying the ink composition comprises applying the ink composition using an anilox delivery system.

18. The process of claim 11, wherein the ink composition further comprises a clay.

19. A process comprising:
    combining at least one component selected from the group consisting of a curable monomer and a curable oligomer; an optional dispersant; an optional photoinitiator; and at least one non-radiation curable additive wherein the non-radiation curable additive is a detergent or an emulsifying agent, or wherein the non-radiation curable additive functions as a detergent or emulsifying agent when in the presence of a cleaning fluid, wherein the non-radiation curable additive is a solid at a temperature of from about 20° C. to about 40° C., and wherein the non-radiation curable additive is behenyl behenate or polycaprolactone-block-polytetrahydrofuran-block-polycaprolactone;

optionally, heating; and optionally, filtering;

to provide an ink composition.

20. The process of claim 19, wherein the at least one non-radiation curable additive polycaprolactone-block-polytetrahydrofuran-block-polycaprolactone.

21. The process of claim 19, wherein the ink composition further comprises a clay.

* * * * *